United States Patent
Lu et al.

(10) Patent No.: US 10,665,301 B1
(45) Date of Patent: May 26, 2020

(54) MEMORY DEVICE WITH COMPENSATION FOR PROGRAM SPEED VARIATIONS DUE TO BLOCK OXIDE THINNING

(71) Applicant: SanDisk Technologies LLC, Addison, TX (US)

(72) Inventors: Ching-Huang Lu, Fremont, CA (US); Ashish Baraskar, Santa Clara, CA (US); Vinh Diep, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/245,491

(22) Filed: Jan. 11, 2019

(51) Int. Cl.
| | | |
|---|---|---|
| *G11C 16/10* | (2006.01) | |
| *G11C 16/04* | (2006.01) | |
| *G11C 16/34* | (2006.01) | |
| *H01L 27/11582* | (2017.01) | |
| *H01L 27/1157* | (2017.01) | |
| *H01L 27/11565* | (2017.01) | |
| *G11C 11/56* | (2006.01) | |
| *G11C 16/26* | (2006.01) | |

(52) U.S. Cl.
CPC .......... *G11C 16/10* (2013.01); *G11C 16/0483* (2013.01); *G11C 16/3459* (2013.01); *H01L 27/1157* (2013.01); *H01L 27/11582* (2013.01); *G11C 11/5671* (2013.01); *G11C 16/26* (2013.01); *H01L 27/11565* (2013.01)

(58) Field of Classification Search
CPC ...... G11C 16/10; G11C 16/0483; G11C 16/26
USPC ........................................ 365/185.11, 185.22
See application file for complete search history.

(56) References Cited

U.S. PATENT DOCUMENTS

| | | |
|---|---|---|
| 9,142,298 B2 | 9/2015 | Dong et al. |
| 9,343,156 B1 | 5/2016 | Mui et al. |
| 9,812,462 B1 | 11/2017 | Pang et al. |
| 9,852,800 B2 | 12/2017 | Lang et al. |
| 9,922,992 B1 | 3/2018 | Yu et al. |
| 10,068,657 B1 | 9/2018 | Yu et al. |

(Continued)

OTHER PUBLICATIONS

Radzi, N. Mond., et al., "Effect of Oxide Thickness Variation in Sub-micron NMOS Transistor," IOP Conference Series: Materials Science and Engineering, vol. 226, No. 1, Dec. 31, 2017, 10 pages.

(Continued)

*Primary Examiner* — Han Yang
(74) *Attorney, Agent, or Firm* — Vierra Magen Marcus LLP

(57) ABSTRACT

Techniques are provided for optimizing a program operation in a memory device to compensate for program speed variations due to block oxide thinning. In one approach, during a program operation, a program voltage which indicates program speed is acquired from sub-blocks with the highest and lowest program speeds. An initial program voltage for intermediate sub-blocks can be determined based on the acquired program voltages and the positions of the intermediate sub-blocks. The technique can accommodate a loss of one or both acquired program voltages if the programming is interrupted. In another approach, a program voltage which indicates program speed is acquired from one sub-block, and for a later-programmed sub-block, an appropriate offset is located from a table and summed with the acquired program voltage to determine an optimum initial program voltage.

10 Claims, 29 Drawing Sheets

(56) References Cited

U.S. PATENT DOCUMENTS

| | | |
|---|---|---|
| 2004/0004857 A1 | 1/2004 | Manea |
| 2008/0310222 A1 | 12/2008 | Roohparvar |
| 2012/0257455 A1* | 10/2012 | Oh .................. G11C 16/10 365/185.22 |
| 2014/0126291 A1 | 5/2014 | Mihnea et al. |
| 2016/0180968 A1 | 6/2016 | Garbe et al. |
| 2018/0211715 A1 | 7/2018 | Cho et al. |
| 2018/0240527 A1 | 8/2018 | Zhang et al. |
| 2019/0096495 A1* | 3/2019 | Shim .................. G11C 16/0483 |

OTHER PUBLICATIONS

Oakley, R.E., "Effect of oxide-layer thickness on the speed of mnos transistors," Abstract, Electronics Letters 7, No. 4, Feb. 25, 1971, 1 page.

International Search Report & The Written Opinion of the International Searching Authority dated Mar. 23, 2020, International Application No. PCT/US2019/063697.

* cited by examiner

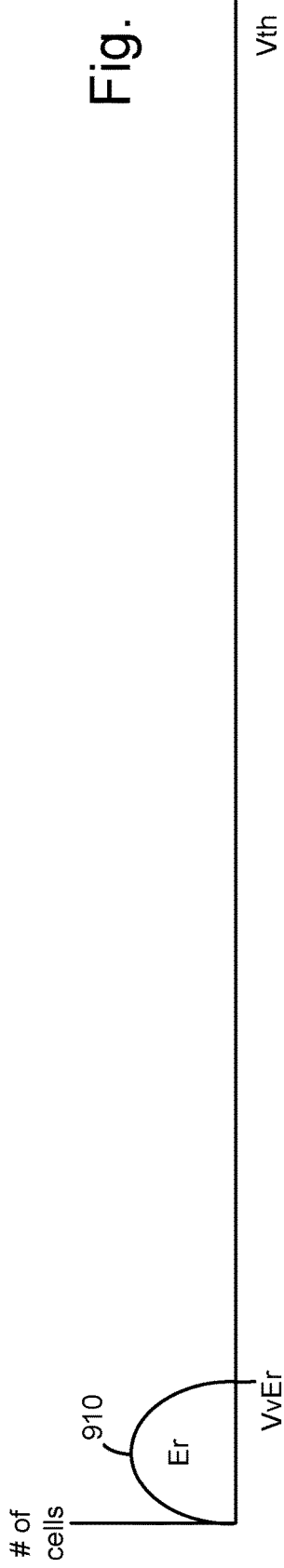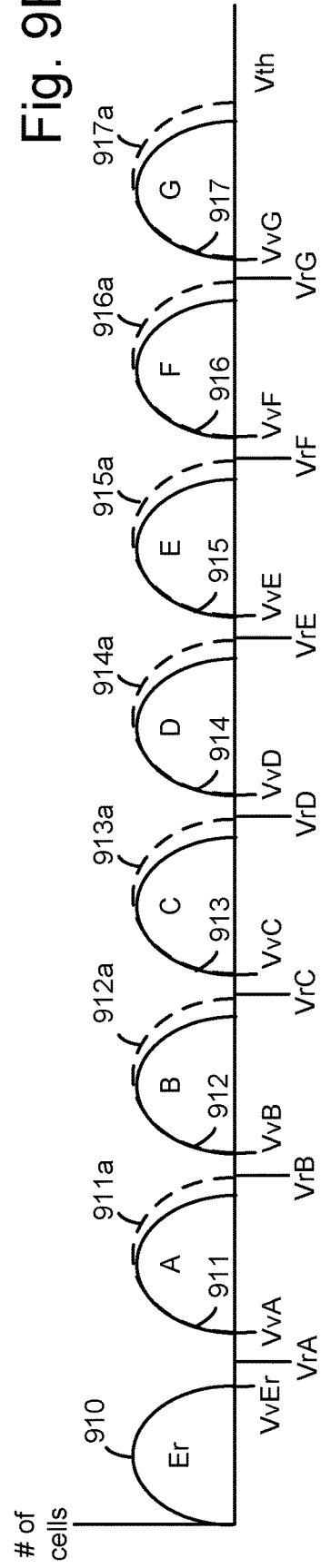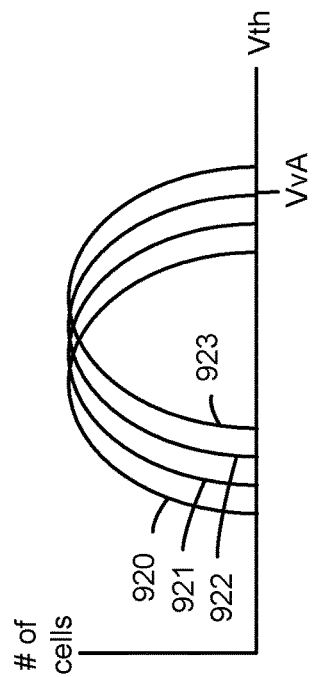

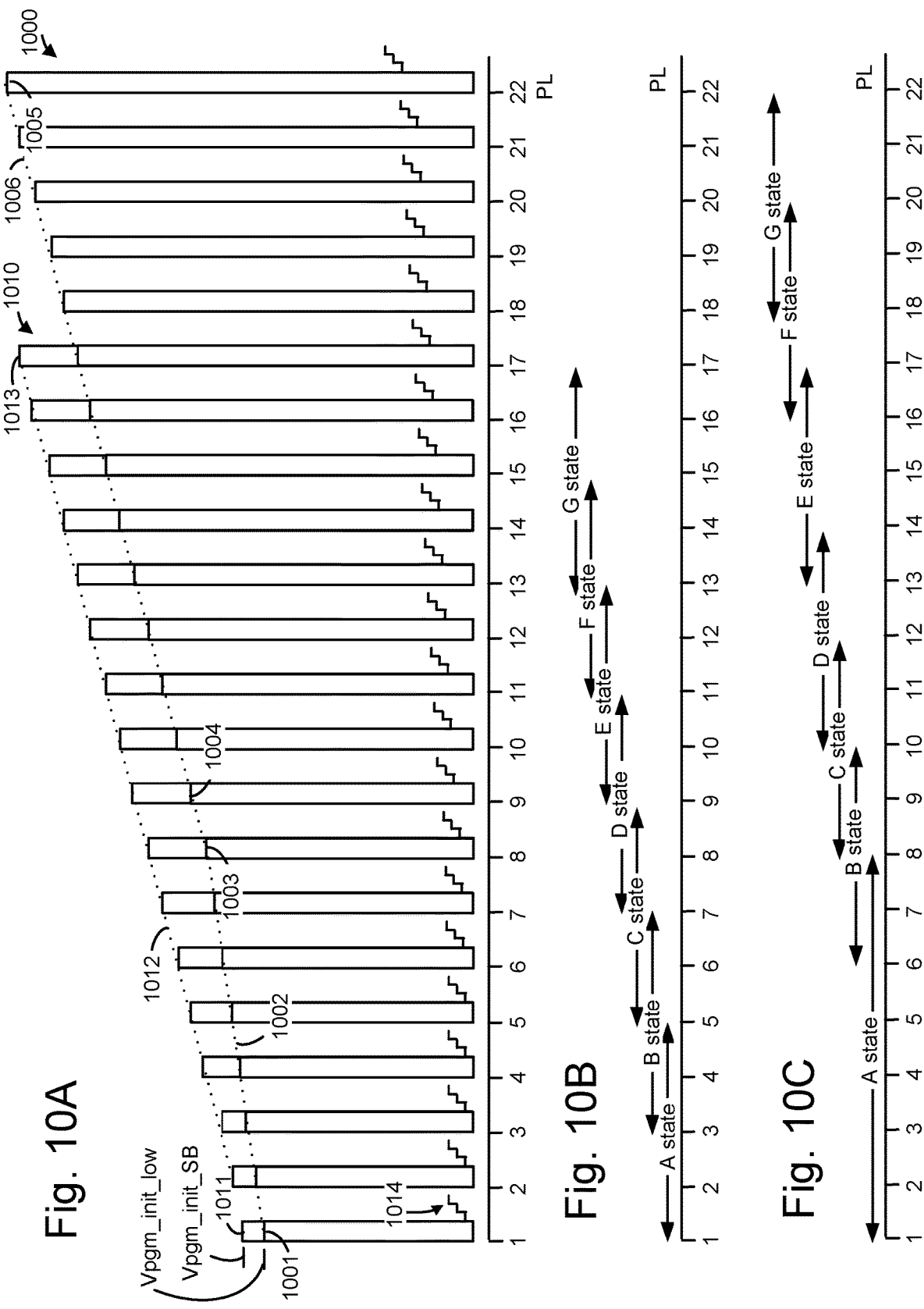

Fig. 11A1
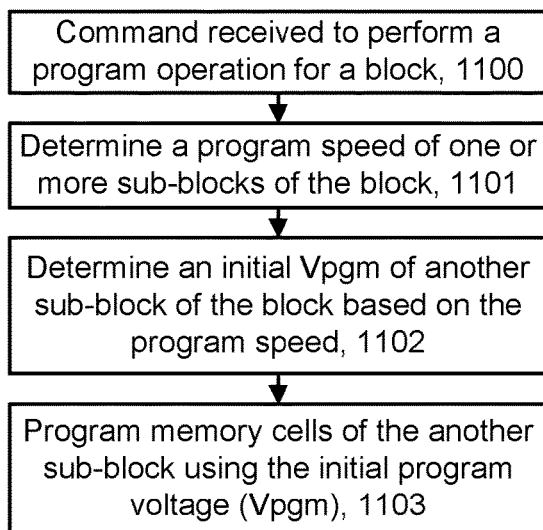
Fig. 11A2
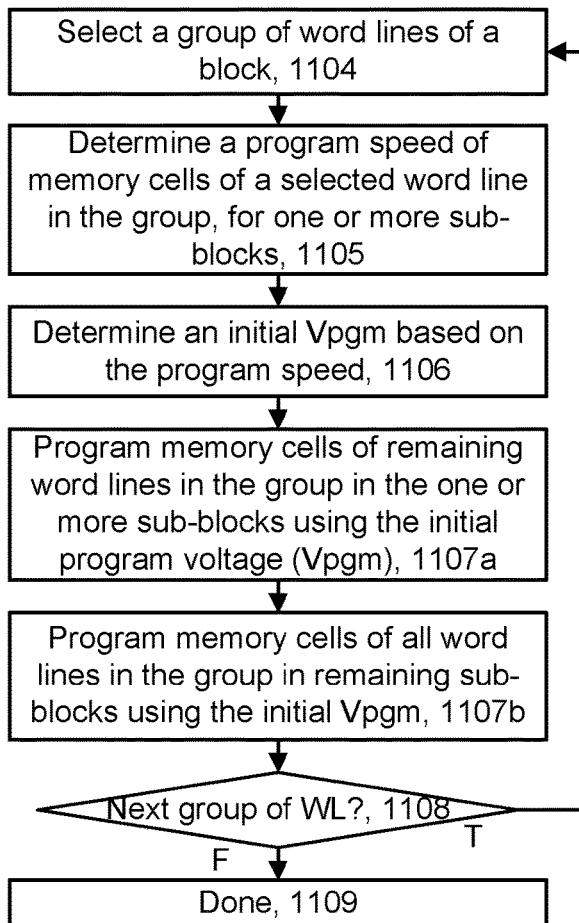
Fig. 11B
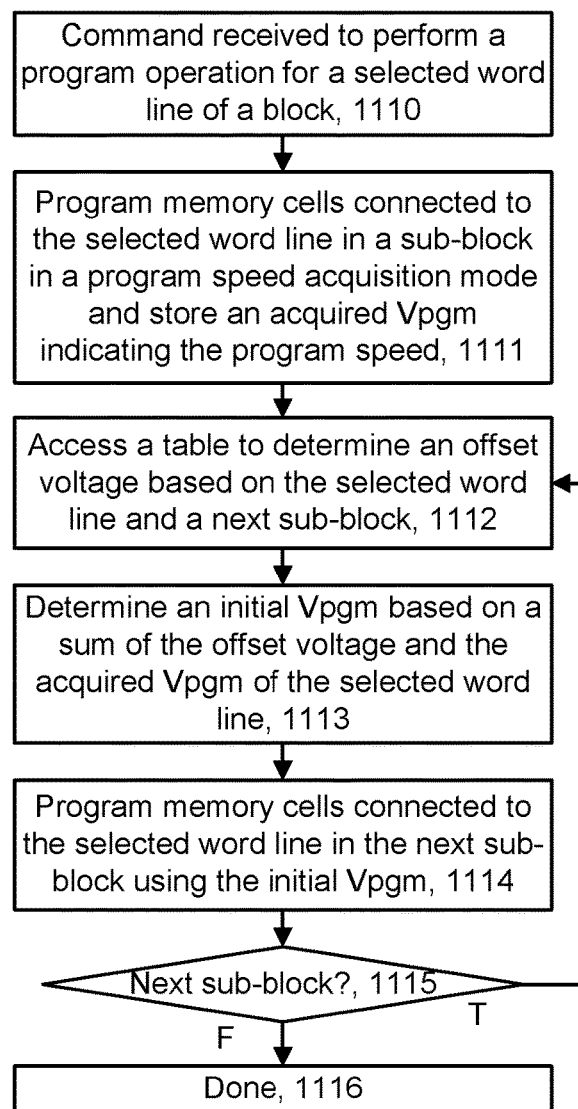

Fig. 11C

|  | SB6 offset | SB1/SB5 offset | SB2/SB4 offset | SB3 offset |
|---|---|---|---|---|
| WL_group4 (WL9-WL10) | 0 V | 0.4 V | 0.8 V | 1.2 V |
| WL_group3 (WL6-WL8) | 0 V | 0.3 V | 0.6 V | 0.9 V |
| WL_group2 (WL3-WL5) | 0 V | 0.2 V | 0.4 V | 0.6 V |
| WL_group1 (WL0-WL2) | 0 V | 0.1 V | 0.2 V | 0.3 V |

Fig. 11D

|  | SB0/SB6 offset | SB5 offset | SB2/SB4 offset | SB3 offset |
|---|---|---|---|---|
| WL_group4 (WL9-WL10) | -0.4 V | 0 V | 0.4 V | 0.8 V |
| WL_group3 (WL6-WL8) | -0.3 V | 0 V | 0.3 V | 0.6 V |
| WL_group2 (WL3-WL5) | -0.2 V | 0 V | 0.2 V | 0.4 V |
| WL_group1 (WL0-WL2) | -0.1 V | 0 V | 0.1 V | 0.2 V |

Fig. 11E

|  | SB7 offset | SB1/SB6 offset | SB2/SB5 offset | SB3/SB4 offset |
|---|---|---|---|---|
| WL_group4 (WL9-WL10) | 0 V | 0.4 V | 0.8 V | 1.2 V |
| WL_group3 (WL6-WL8) | 0 V | 0.3 V | 0.6 V | 0.9 V |
| WL_group2 (WL3-WL5) | 0 V | 0.2 V | 0.4 V | 0.6 V |
| WL_group1 (WL0-WL2) | 0 V | 0.1 V | 0.2 V | 0.3 V |

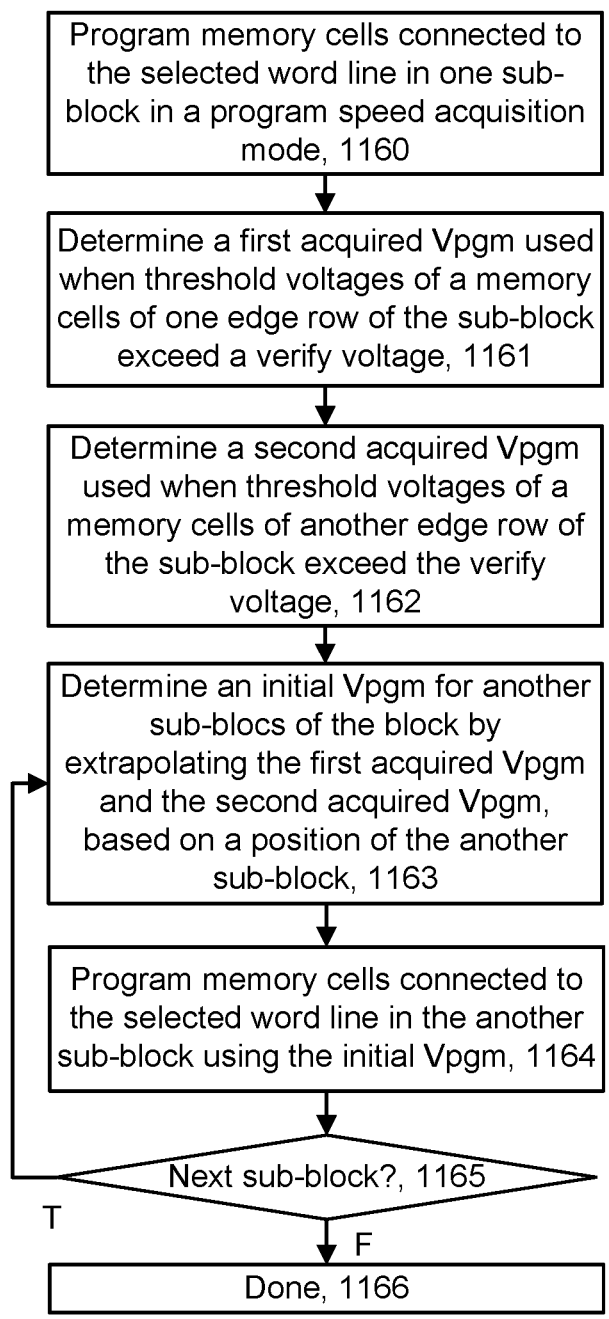

Fig. 13A (1) Program SB0 using Vpgm_init_low to acquire Vpgm_acq_SB0 (e.g., 16 V),
(2) Program SB1 using Vpgm_init_low to acquire Vpgm_acq_SB1 (e.g., 15 V),
(3) Calculate Vpgm_init_SB3=Vpgm_acq_SB1+1/3(Vpgm_acq_SB0-Vpgm_acq_SB1)=15.33 V
(4) Calculate Vpgm_init_SB5=Vpgm_acq_SB1+2/3(Vpgm_acq_SB0-Vpgm_acq_SB1)=15.67 V
(5) Program SB2 using Vpgm_init=Vpgm_acq_SB1
(6) Program SB3 using Vpgm_init_SB3
(7) Program SB4 using Vpgm_init_SB3
(8) Program SB5 using Vpgm_init_SB5
(9) Program SB6 using Vpgm_init_SB5

Fig. 13B (1) Program SB0 using Vpgm_init_low to acquire Vpgm_acq_SB0 (e.g., 16 V),
(2) Interruption, Vpgm_acq_SB0 is overwritten
(3) Program SB1 using Vpgm_init_low to acquire Vpgm_acq_SB1 (e.g., 15 V),
(4) Program SB2 using Vpgm_init=Vpgm_acq_SB1
(5) Program SB3 using Vpgm_init=Vpgm_acq_SB1
(6) Program SB4 using Vpgm_init=Vpgm_acq_SB1
(7) Program SB5 using Vpgm_init=Vpgm_acq_SB1
(8) Program SB6 using Vpgm_init=Vpgm_acq_SB1

Fig. 13C (1) Program SB0 using Vpgm_init_low to acquire Vpgm_acq_SB0_R1 (e.g., 15.95 V) and Vpgm_SB0_R4 (e.g., 16.1 V)
(2) Calculate Vpgm_init_SB1=Vpgm_acq_SB0_R4+0.5x(Vpgm_acq_SB0_R4-Vpgm_acq_SB0_R1)=16.1+0.5x(16.1-15.95)=16.175 V
(3) Calculate Vpgm_init_SB2=Vpgm_init_SB1+(Vpgm_acq_SB0_R4-Vpgm_acq_SB0_R1)=16.175+0.15=16.325 V
(4) Calculate Vpgm_init_SB3=Vpgm_init_SB2+(Vpgm_acq_SB0_R4-Vpgm_acq_SB0_R1)=16.325+0.15=16.475 V
(5) Calculate Vpgm_init_SB6=0.5x(Vpgm_acq_SB0_R4+Vpgm_acq_SB0_R1)=0.5x(15.95+16.1)=16.025 V
(6) Program SB1 using Vpgm_init_SB1
(7) Program SB2 using Vpgm_init_SB2
(8) Program SB3 using Vpgm_init_SB3
(9) Program SB4 using Vpgm_init_SB2
(10) Program SB5 using Vpgm_init_SB1
(11) Program SB6 using Vpgm_init_SB6

MEMORY DEVICE WITH COMPENSATION FOR PROGRAM SPEED VARIATIONS DUE TO BLOCK OXIDE THINNING

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings (e.g., NAND chains), for instance. However, various challenges are presented in operating such memory devices.

BRIEF DESCRIPTION OF THE DRAWINGS

FIG. 9A depicts a threshold voltage (Vth) distribution of a set of memory cells at the start of a program operation.

FIG. 9B depicts a Vth distribution of a set of memory cells after the program operation, showing the effects of over-programming.

FIG. 9C depicts Vth distributions of memory cells of different sub-blocks being programmed to the A state to determine program speed.

FIG. 10A depicts example voltage signals used in a program operation, including a voltage signal 1000 used in a program speed acquisition mode and voltage signal 1010 used in a normal program mode.

FIG. 10B depicts an example of the verification of different data states in the different program loops of FIG. 10A using the voltage signal 1010.

FIG. 10C depicts an example of the verification of different data states in the different program loops of FIG. 10A using the voltage signal 1000.

FIG. 11A1 depicts a flowchart of an example program operation in which a program speed is acquired from one or more sub-blocks and used to determine an initial program voltage for another sub-block.

FIG. 11A2 depicts a flowchart of an example implementation of FIG. 11A1 for groups of word lines.

FIG. 11B depicts a flowchart of a first example implementation of the process of FIG. 11A1 in which a table such as in FIG. 11C-11E is accessed to determine an optimized initial program voltage for a sub-block based on the selected word line and the selected sub-block.

FIG. 11C depicts an example table for use in the process of FIG. 11B for an example block with seven sub-blocks SB0-SB6, consistent with FIG. 14A, where the program speed is acquired from SB0.

FIG. 11D depicts an example table for use in the process of FIG. 11B for an example block with seven sub-blocks SB0-SB6, consistent with FIG. 14A, where the program speed is acquired from SB1.

FIG. 11E depicts an example table for use in the process of FIG. 11B for an example block with eight sub-blocks SB0-SB7, consistent with FIG. 16A, where the program speed is acquired from SB0.

FIG. 11I depicts a flowchart of a third example implementation of the process of FIG. 11A1 in which acquired program voltages from edge rows or other selected rows of a sub-block are used to determine an initial Vpgm for another sub-block.

FIG. 13A depicts an example implementation of the process of FIG. 11G, consistent with the sub-block order 1421 of FIG. 14A, where there is no interruption in the programming of the block.

FIG. 13B depicts an example implementation of the process of FIG. 11G, consistent with the sub-block order 1421 of FIG. 14A, where there is an interruption between the programming of SB0 and SB1.

FIG. 13C depicts an example implementation of the process of FIG. 11I, consistent with the sub-block order 1420 of FIG. 14A, where there is no interruption in the programming of the block.

DETAILED DESCRIPTION

Figure 1:
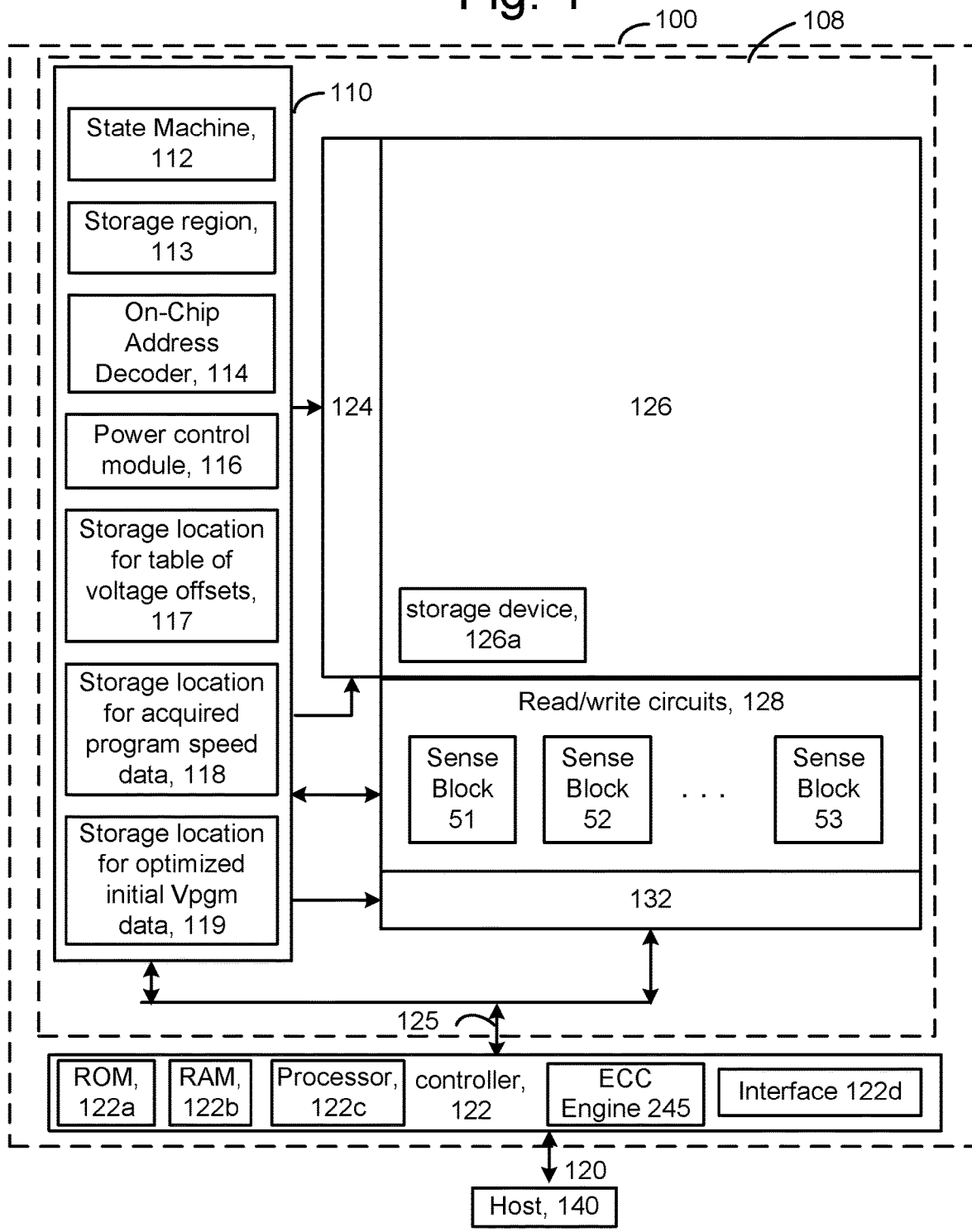
FIG. 1 is a block diagram of an example memory device.

Apparatuses and techniques are described for optimizing a program operation in a memory device to compensate for program speed variations due to block oxide thinning.

In some memory devices, memory cells are joined to one another such as in NAND strings in a block or sub-block. Each NAND string comprises a number of memory cells connected in series between one or more drain end select gate transistors (referred to as SGD transistors), on a drain end of the NAND string which is connected to a bit line, and one or more source end select gate transistors (referred to as SGS transistors), on a source end of the NAND string or other memory string or set of connected memory cells which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells.

The memory cells can include data memory cells, which are eligible to store user data, and dummy or non-data memory cells which are ineligible to store user data. A dummy memory cell may have the same construction as a data memory cell but is considered by the controller to be ineligible to store any type of data including user data. A dummy word line is connected to a dummy memory cell. One or more dummy memory cells may be provided at the drain and/or source ends of a string of memory cells to provide a gradual transition in the channel voltage gradient.

In some 3D memory structures, the memory cells are arranged in vertical NAND strings (or other sets of connected memory cells) in a stack, where the stack comprises alternating conductive and dielectric layers. In this structure, the conductive layers act as word lines which are connected to the memory cells. Further, the memory cells may be formed by annular layers of blocking oxide, charge-trapping material, tunnel oxide and channel polysilicon which extend in the stack. The layers may be arranged concentrically. Each NAND string may have the shape of a pillar which intersects with the word lines to form the memory cells.

Each memory cell may be associated with a data state according to write data in a program command. Based on its data state, a memory cell will either remain in the erased state or be programmed to a programmed data state. For example, in a single bit per cell memory device, also referred to as SLC, or single level cell, there are two data states including the erased state and the programmed state. MLC or multi-level cells store two or more bits per cell, as a multiple bit memory cell. For example, in a two-bit per cell memory device, there are four data states including the erased state and three higher data states referred to as the A, B and C data states. In a three-bit per cell memory device, there are eight data states including the erased state and seven higher data states referred to as the A-G data states (see FIG. 9B). In a four-bit per cell memory device, there are sixteen data states including the erased state (S0) and fifteen higher data states, S0-S15.

A program operation may use a set of increasing program voltages or pulse which are applied to the word line in respective program loops or program-verify iterations in one or more program passes, such as depicted in FIG. 10A.

In some cases, verify tests may be performed after each program voltage to determine whether the memory cells have completed programming. A verify test can involve applying a verify voltage of an assigned data state to the selected word line while sensing circuitry determines whether cells connected to the word line are in a conductive or non-conductive state. As in a read operation, the voltages of the unselected word lines are set to a read pass voltage which is high enough to place the unselected memory cells in a strongly conductive state, to avoid interfering with the sensing of the selected memory cells. If a memory cell is in a non-conductive state, the Vth of the memory cell exceeds the control gate voltage and the memory cell has reached the assigned data state. Programming is thus completed for the memory cell, and it can be locked out from further programming while programming continues for other memory cells in subsequent program loops.

After the memory cells are programmed, the data can be read back in a read operation. A read operation can involve applying a series of read voltages to a word line while sensing circuitry determines whether cells connected to the word line are in a conductive or non-conductive state. If a memory cell is in a non-conductive state, the Vth of the memory cell exceeds the read voltage. The read voltages are set at levels which are expected to be between the threshold voltage levels of adjacent data states. During the read operation, the voltages of the unselected word lines are set at a read pass voltage which is high enough to place the unselected memory cells in a strongly conductive state, to avoid interfering with the sensing of the selected memory cells.

However, the program speed can vary for memory cells of different memory holes based on their distance from the edge of a block, where an etchant is introduced to remove the sacrificial material of the word lines before depositing the metal of the word lines. See FIG. 14D. In particular, in addition to removing the sacrificial material, the etchant removes some of the blocking oxide layer 663, 663a, 663b and 663c of the memory cells. Moreover, the blocking oxide layers which are closest to the edge of the block receive the most etching and become the thinnest. A thinner blocking oxide layer results in a faster program speed because the gate-to-channel distance decreases. With a given gate-to-channel voltage such as in a program operation, the electric field strength is larger when the gate-to-channel distance is smaller. Thus, the thickness Th (FIGS. 14C and 16C) of the blocking oxide layers, which may comprise silicon dioxide ($SiO2$), varies for memory holes based on their distance from the closest edge of the block from which an etchant is introduced.

Techniques provided herein address the above and other issues. In one implementation, a program parameter such as an initial program voltage is optimized based on a measured program speed, which in turn is a function of the thickness of the blocking oxide layer. The program parameter can be optimized for different sub-blocks of a block, and for different word lines or groups of word lines within a sub-block. In one approach, tests are performed to determine the program speeds of the different sub-blocks and groups of word lines within a sub-block. A table is populated with offset voltages based on the tests. See FIG. 11C to 11E. During a program operation, a program voltage which indicates program speed is acquired from a selected word line of a sub-block. This can be a program voltage in a program loop in which a program milestone is reached, as explained in connection with FIG. 9C. For a later-programmed sub-block, an appropriate offset is located from the table and summed with the acquired program voltage to determine an optimum initial program voltage for programming memory cells connected to the selected word line in the next-programmed sub-block. See FIGS. 15A and 17A where the solid square denotes an acquired program voltage and the open squares denote initial program voltages obtained from a table based on the acquired program voltage. By optimizing the initial program voltage, the program operation can be completed with an optimal program time and optimal Vth distribution widths.

In contrast, without an optimization, the initial program voltage might be too high, in which case the memory cells can be over-programmed, or too low, in which case the program time becomes too high due to the use of additional, unnecessary program loops.

Figure 14A:
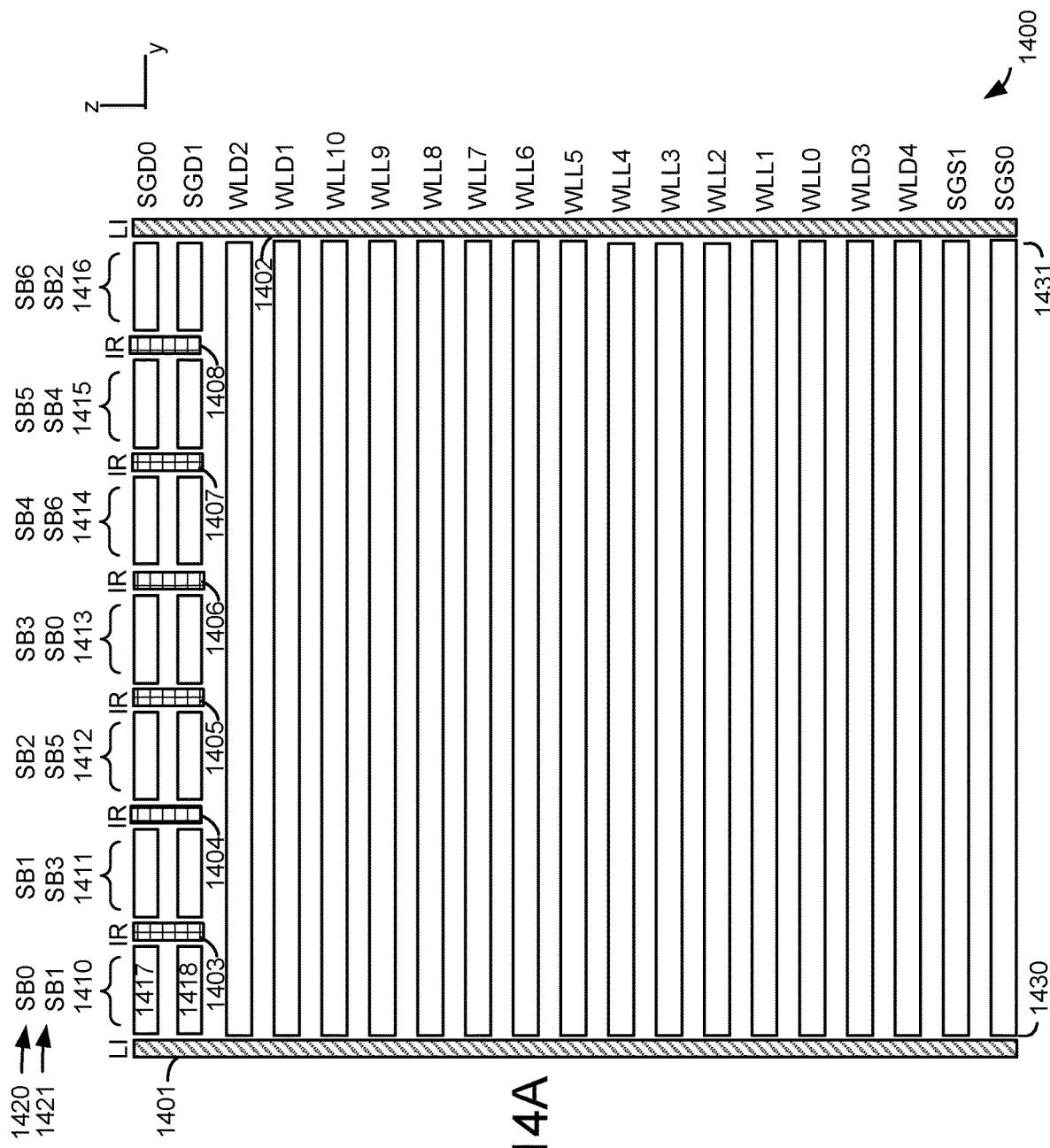
FIG. 14A depicts a side view of an example block 1400 with seven sub-blocks, consistent with FIG. 5A.

In another implementation, the program speed is measured or acquired during a program operation for two sub-blocks, such as a central sub-block and an edge sub-block, and an optimized initial program voltage is determined for intermediate sub-blocks between the central sub-block and an edge sub-block by interpolating between the acquired program speeds. For example, see the central sub-block 1413, edge sub-blocks 1410 and 1416, and intermediate sub-blocks 1411, 1412, 1414 and 1415 in FIG. 14A, and the central sub-blocks 1613 and 1614, edge sub-blocks 1610 and 1617, and intermediate sub-blocks 1611, 1612, 1615 and 1616 in FIG. 16A. See also the example of FIGS. 13A, 15B and 17B. In FIGS. 15B and 17B, the solid squares denote acquired program voltages and the open squares denote initial program voltages obtained by interpolating between the acquired program voltages.

The program speed can acquired from the central sub-block and edge sub-block since they have the lowest and highest program speeds, respectively, and therefore provide the boundary values of a range of program speeds for the sub-blocks of the block. This implementation can involve programming in which one or more sub-blocks with the lowest program speed are programmed first, one or more sub-blocks with the highest program speed are programmed next, and sub-blocks with intermediate program speeds (between the lowest and highest program speeds) are programmed subsequently. After the one or more sub-blocks with the lowest program speed are programmed, the sub-blocks can be programmed in a reverse order of their program speed, e.g., sub-blocks with the highest program speed first and sub-blocks with successively lower program speeds successively later.

An advantage of this approach is that if the programming of the block is interrupted and the program speed data is overwritten, the programming of the block can resume with the sub-block having the highest program speed among the sub-blocks which have not yet been programmed. Specifically, when the programming resumes, a program speed can be newly acquired and used to set the initial program voltage for remaining sub-blocks with the successively lower program speeds. See the examples of FIGS. 13B and 13C. This approach avoids over-programming because the optimized initial program voltage will be relatively low for a sub-block with a relatively high program speed. When this relatively low initial program voltage is used for the next sub-block which has a lower program speed, there will be little risk of over-programming. There will be some risk of unnecessary program loops which increase the program time, but this is preferable to over-programming since there is only a small performance penalty instead of an increased risk of a read error.

Figure 14B:
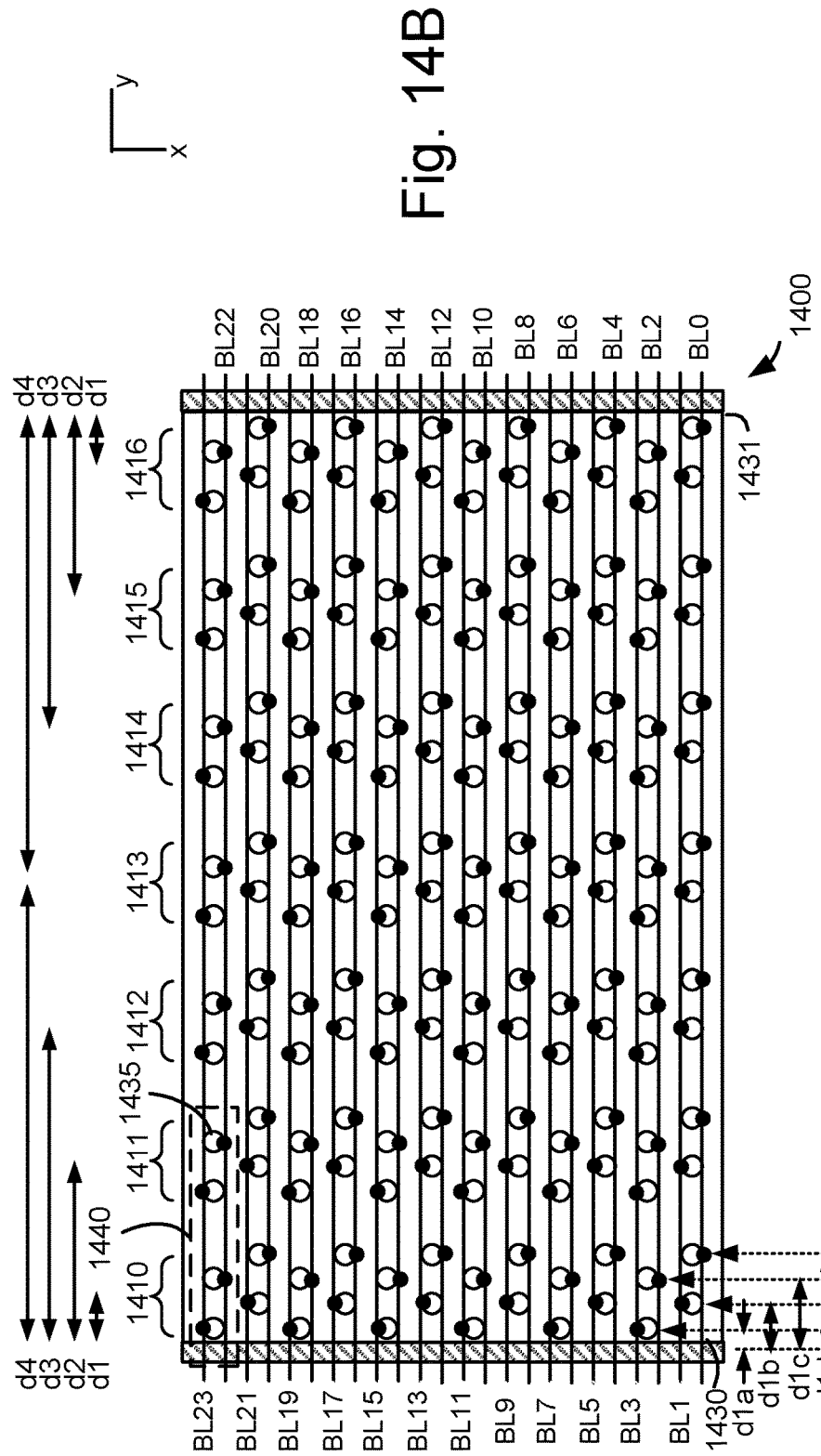
FIG. 14B depicts a top view of the example block 1400 of FIG. 14A.

In another implementation, the program speed is acquired during a program operation for a selected, single sub-block which can be a central sub-block, edge sub-block or any other sub-block. The program speed is acquired for two rows of memory cells of the selected sub-block, such as the two opposing edge rows of the sub-block. See FIGS. 14B and 16B and rows R1 and R4, for example. An optimized initial program voltage is determined for remaining sub-blocks (other than the selected sub-block) by extrapolating the acquired program speeds to the remaining blocks based on their position relative to the selected sub-block or their position within the block. See the example of FIGS. 13C, 15C and 17C. In FIGS. 15C and 17C, the solid squares denote acquired program voltages from rows and the open squares denote initial program voltages obtained by extrapolating the acquired program voltages. This approach advantageously can use a program speed acquisition mode for a single sub-block rather than for two sub-blocks, thereby reducing program time since the program speed acquisition mode uses more program loops than a normal program mode.

These and other features are discussed further below.

FIG. 1 is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, ... 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 125.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, a power control module 116 (power control circuit), a storage location for a table of voltage offsets 117, a storage location for acquired program speed data 118 and a storage location for optimized initial program voltage (Vpgm) data 119. The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach. The storage location for the table of voltage offsets 117 can include data such as depicted in FIG. 11C to 11E for one or more blocks, and can be a non-volatile storage medium such as ROM fuses.

Figure 15A:
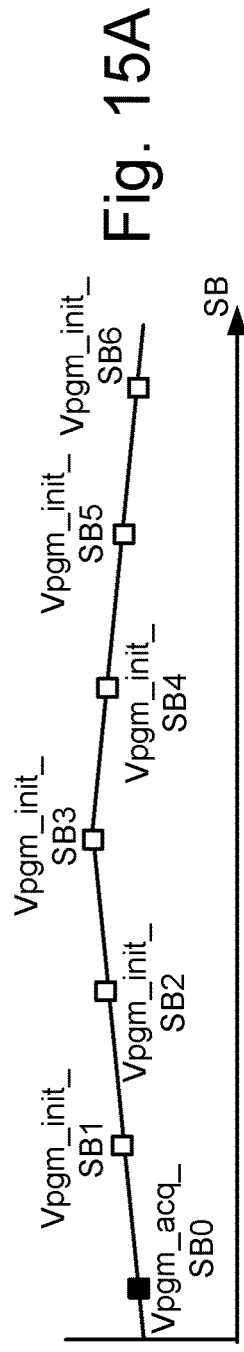
FIG. 15A depicts a plot of program voltages versus sub-block position, consistent with the block of FIG. 14A, the process of FIG. 11B and the table of FIG. 11C.
Figure 15B:
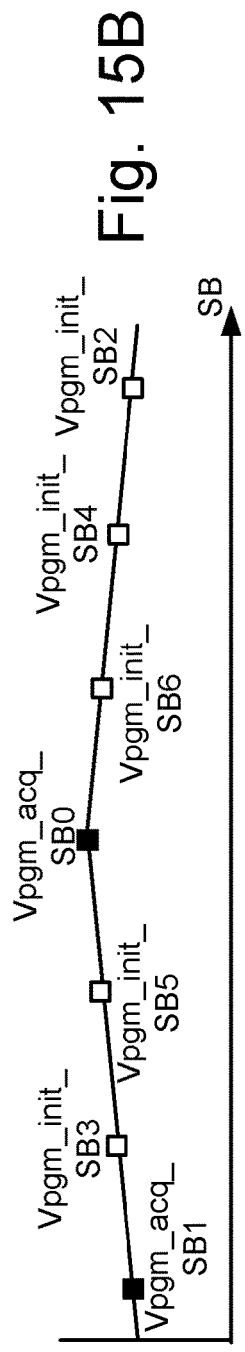
FIG. 15B depicts a plot of program voltages versus sub-block position, consistent with the block of FIG. 14A and the process of FIGS. 11F, 11G and 13A.
Figure 15C:
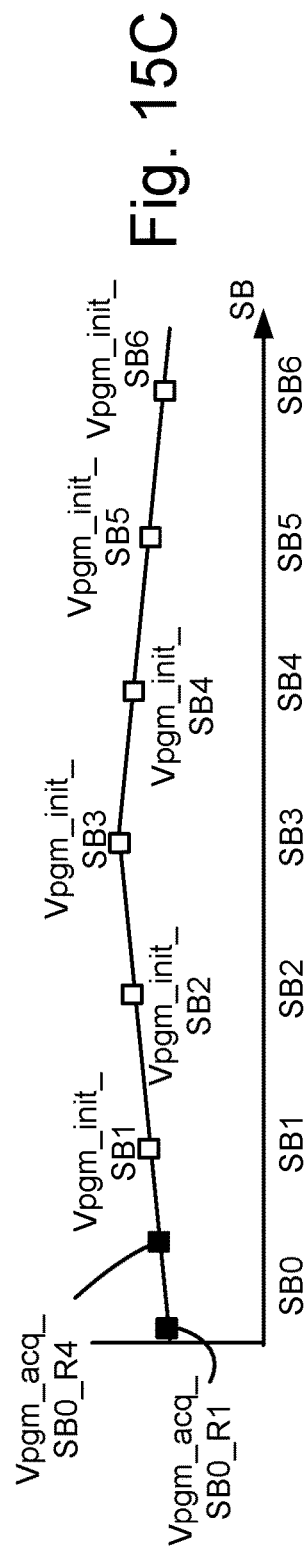
FIG. 15C depicts a plot of program voltages versus sub-block position, consistent with the block of FIG. 14A and the process of FIGS. 11I, 11J and 13C.
Figure 16A:
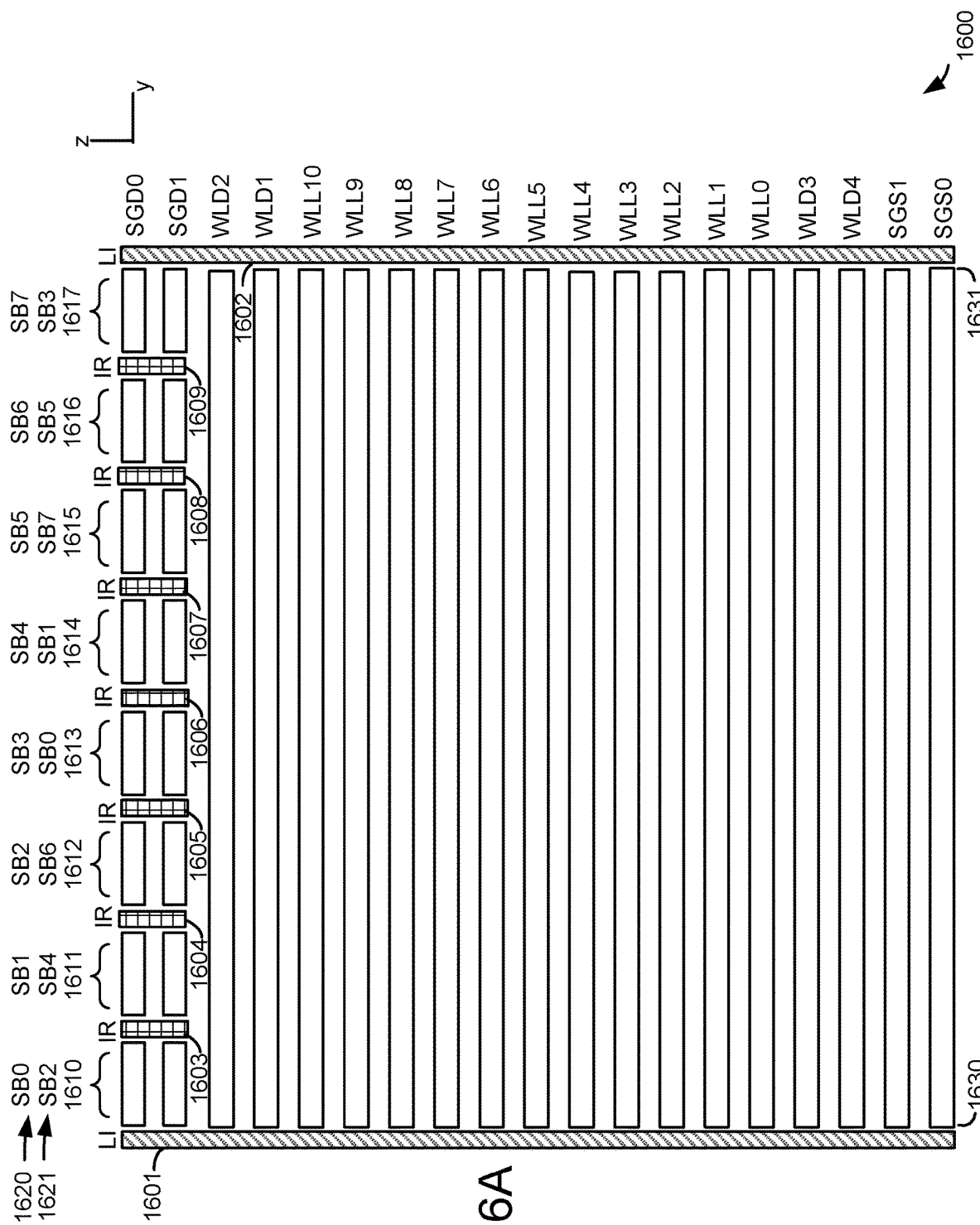
FIG. 16A depicts a side view of an example block 1600 with eight sub-blocks, consistent with FIG. 5A.
Figure 16B:
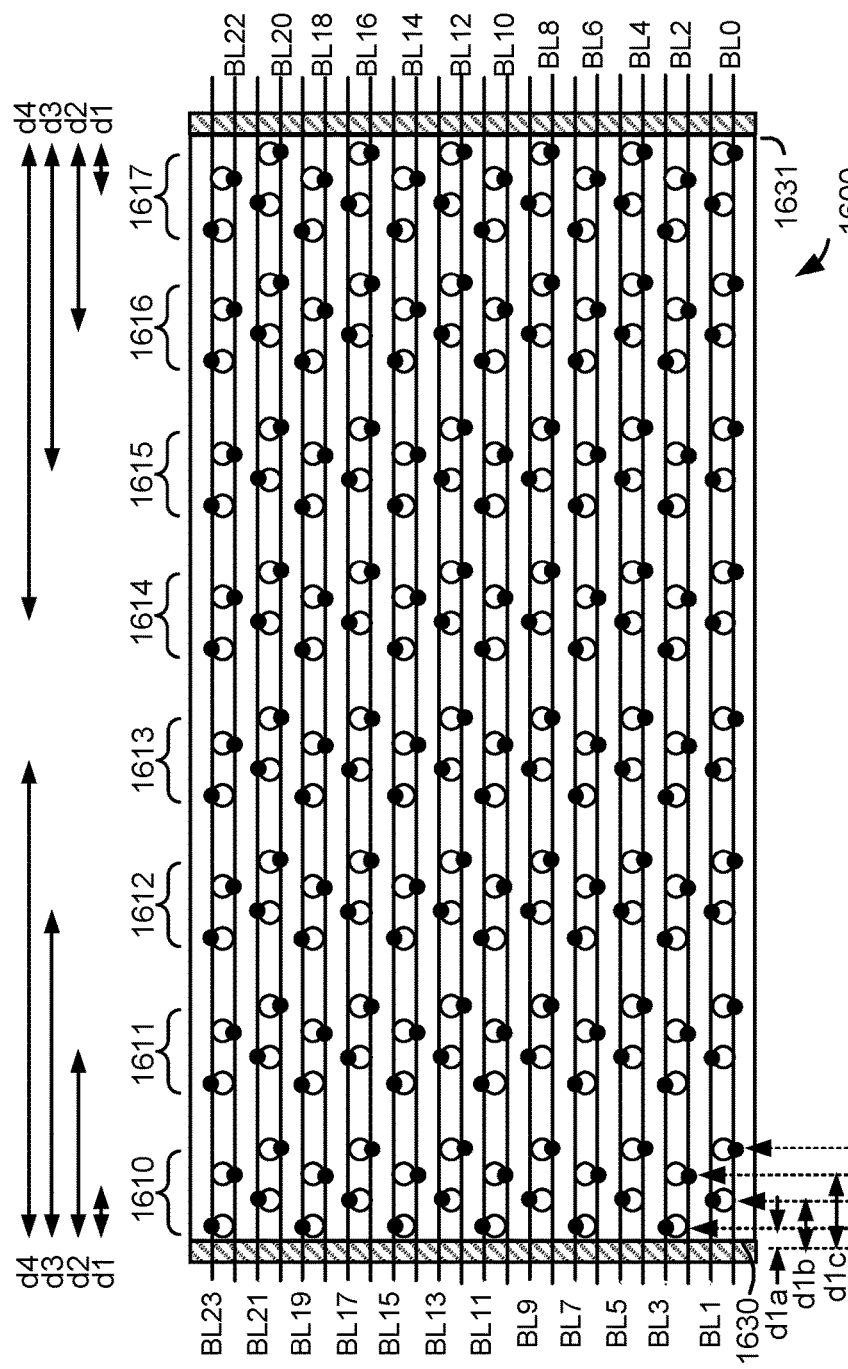
FIG. 16B depicts a top view of the example block 1600 of FIG. 16A.
Figure 17A:
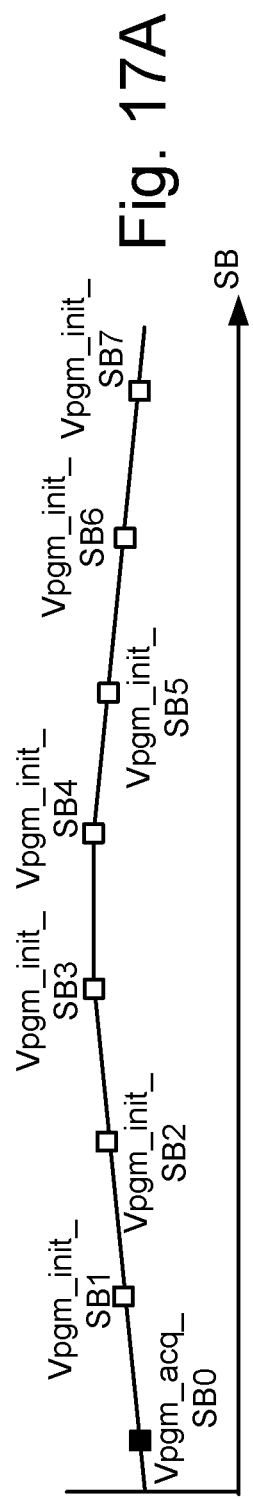
FIG. 17A depicts a plot of program voltages versus sub-block position, consistent with the block of FIG. 17A, the process of FIG. 11B and the table of FIG. 11E.
Figure 17B:
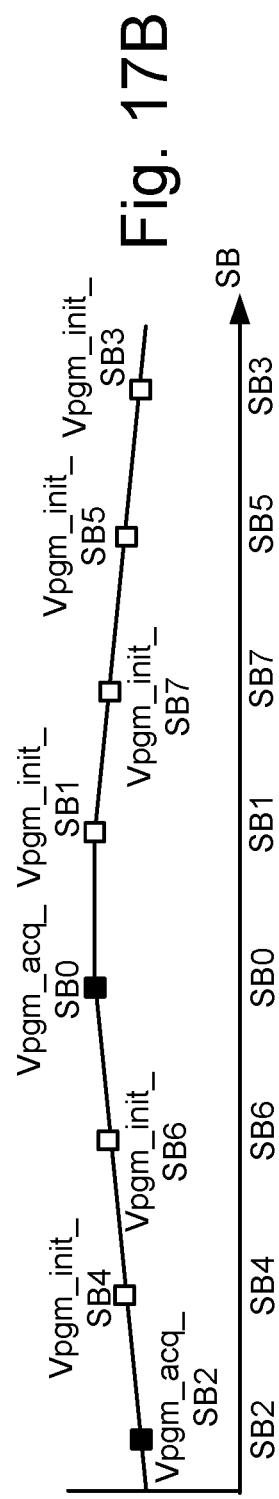
FIG. 17B depicts a plot of program voltages versus sub-block position, consistent with the block of FIG. 17A and the process of FIGS. 11F and 11G.
Figure 17C:
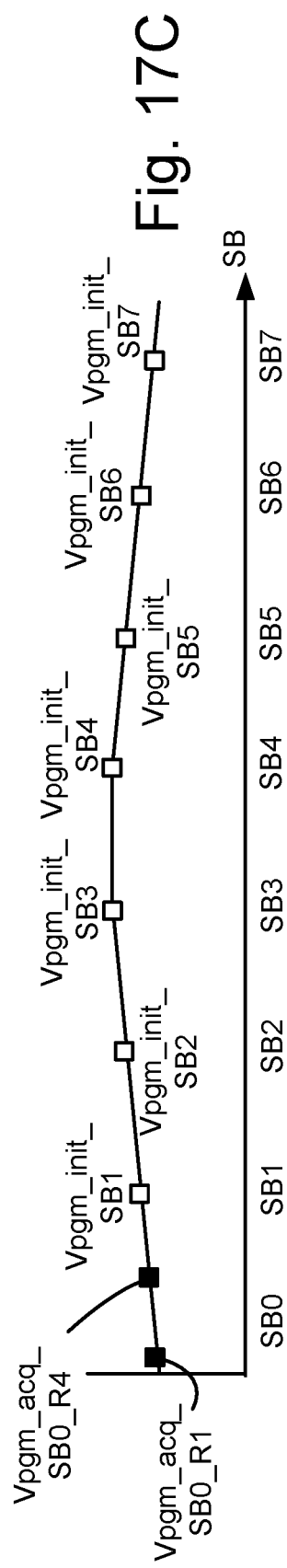
FIG. 17C depicts a plot of program voltages versus sub-block position, consistent with the block of FIG. 17A and the process of FIGS. 11I and 11J.

The storage location for the acquired program speed data 118 can include values such as Vpgm_acq_SB0 in FIG. 15A, Vpgm_acq_SB0 and Vpgm_acq_SB1 in FIG. 15B, Vpgm_acq_SB0_R1 and Vpgm_acq_SB0_R4 in FIG. 15C, Vpgm_acq_SB0 in FIG. 17A, Vpgm_acq_SB0 and Vpgm_acq_SB2 in FIG. 17B, and Vpgm_acq_SB0_R1 and Vpgm_acq_SB0_R4 in FIG. 17C. This storage location can be a volatile storage medium such as RAM or DRAM.

The storage location for the optimized initial Vpgm data 119 can include data such as Vpgm_init_SB1-Vpgm_init_SB6 in FIG. 15A, Vpgm_init_SB2-Vpgm_init_SB6 in FIG. 15B, Vpgm_init_SB1-Vpgm_init_SB6 in FIG. 15C, Vpgm_init_SB1-Vpgm_init_SB7 in FIG. 17A, Vpgm_init_SB1 and Vpgm_init_SB3-Vpgm_init_SB7 in FIG. 17B, and Vpgm_init_SB1-Vpgm_init_SB7 in FIG. 17C. This storage location can be a volatile storage medium.

In some implementations, some of the components can be combined. In various designs, one or more of the components (alone or in combination), other than memory structure 126, can be thought of as at least one control circuit which is configured to perform the techniques described herein including the steps of the processes described herein. The control circuit is configured to program memory cells by applying one or more program pulses to a selected word line, and to apply program-inhibit and program-enable bit line voltages during the program pulses.

For example, a control circuit such as a programming circuit may include any one of, or a combination of, control circuitry 110, state machine 112, decoders 114 and 132, power control module 116, sense blocks 51, 52, ... , 53, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

The controller 122 or control circuitry 110 can be configured with hardware, firmware and/or software for implementing the techniques described herein.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/ or over a substrate may be arranged in two or three dimensions, such as a 2D memory structure or a 3D memory structure. In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
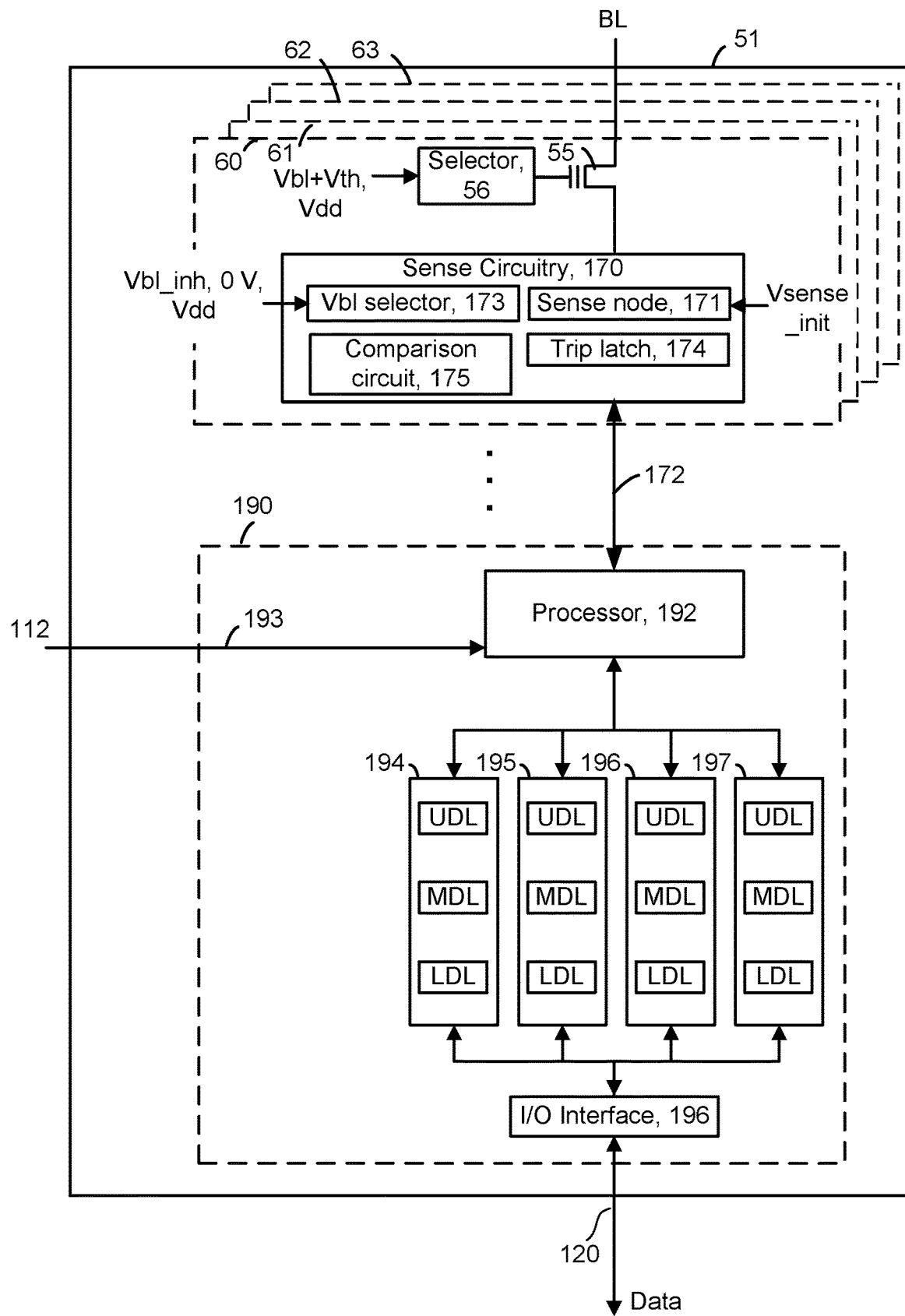
FIG. 2 is a block diagram depicting one embodiment of the sense block 51 of FIG. 1.

FIG. 2 is a block diagram depicting one embodiment of the sense block 51 of FIG. 1. An individual sense block 51 is partitioned into one or more core portions, referred to as sense circuits 60-63 or sense amplifiers, and a common portion, referred to as a managing circuit 190. In one embodiment, there will be a separate sense circuit for each bit line/NAND string and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements (memory cells).

The sense circuit 60, as an example, comprises sense circuitry 170 that performs sensing by determining whether a conduction current in a connected bit line is above or below a predetermined threshold level. The sensing can occur in a read or verify operation. The sense circuit also supplies a bit line voltage during the application of a program voltage in a program operation.

The sense circuitry may include a Vbl selector 173, a sense node 171, a comparison circuit 175 and a trip latch 174. During the application of a program voltage, the Vbl selector 173 can pass a program-inhibit voltage Vbl_inh (e.g., 2 V) to a bit line connected to a memory cell which is inhibited from programmed, or a program-enable voltage, e.g., 0 V, to a bit line connected to a memory cell which is being programmed in the current program loop. A transistor 55 (e.g., an nMOS) can be configured as a pass gate to pass Vbl from the Vbl selector 173, by setting the control gate voltage of the transistor sufficiently high, e.g., higher than the Vbl passed from the Vbl selector. For example, a selector 56 may pass a power supply voltage Vdd, e.g., 3-4 V to the control gate of the transistor 55.

During sensing operations such as read and verify operations, the bit line voltage is set by the transistor 55 based on the voltage passed by the selector 56. The bit line voltage is roughly equal to the control gate voltage of the transistor minus its Vth (e.g., 1 V). For example, if Vbl+Vth is passed by the selector 56, the bit line voltage will be Vbl. This assumes the source line is at 0 V. The transistor 55 clamps the bit line voltage according to the control gate voltage and acts a source-follower rather than a pass gate. The Vbl selector 173 may pass a relatively high voltage such as Vdd which is higher than the control gate voltage on the transistor 55 to provide the source-follower mode. During sensing, the transistor 55 thus charges up the bit line.

In one approach, the selector 56 of each sense circuit can be controlled separately from the selectors of other sense circuits, to pass Vbl or Vdd. The Vbl selector 173 of each sense circuit can also be controlled separately from the Vbl selectors of other sense circuits.

During sensing, the sense node 171 is charged up to an initial voltage such as Vsense_init=3 V. The sense node is then connected to the bit line via the transistor 55, and an amount of decay of the sense node is used to determine whether a memory cell is in a conductive or non-conductive state. The comparison circuit 175 is used to compare the sense node voltage to a trip voltage at a sense time. If the sense node voltage decays below the trip voltage Vtrip, the memory cell is in a conductive state and its Vth is at or below the voltage of the verification signal. If the sense node voltage does not decay below Vtrip, the memory cell is in a non-conductive state and its Vth is above the voltage of the verification signal. The sense circuit 60 includes a trip latch 174 that is set by the comparison circuit 175 based on whether the memory cell is in a conductive or non-conductive state. The data in the trip latch can be a bit which is read out by the processor 192.

The managing circuit 190 comprises a processor 192, four example sets of data latches 194-197 and an I/O Interface 196 coupled between the set of data latches 194 and data bus 120. One set of data latches, e.g., comprising individual latches LDL, MDL and UDL, can be provided for each sense circuit. In some cases, additional data latches may be used. LDL stores a bit for a lower page of data, MDL stores a bit for a lower page of data, and UDL stores a bit for an upper page of data. This is in an eight-level or three-bits per memory cell memory device.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120, in the LDL, MDL and UDL latches, in a three-bit per memory cells implementation.

The program operation, under the control of the state machine, applies a set of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. An MDL or UDL latch is flipped when a middle or upper page bit, respectively, is stored in an associated memory cell. This occurs when an associated memory cell completes programming.

Figure 3:
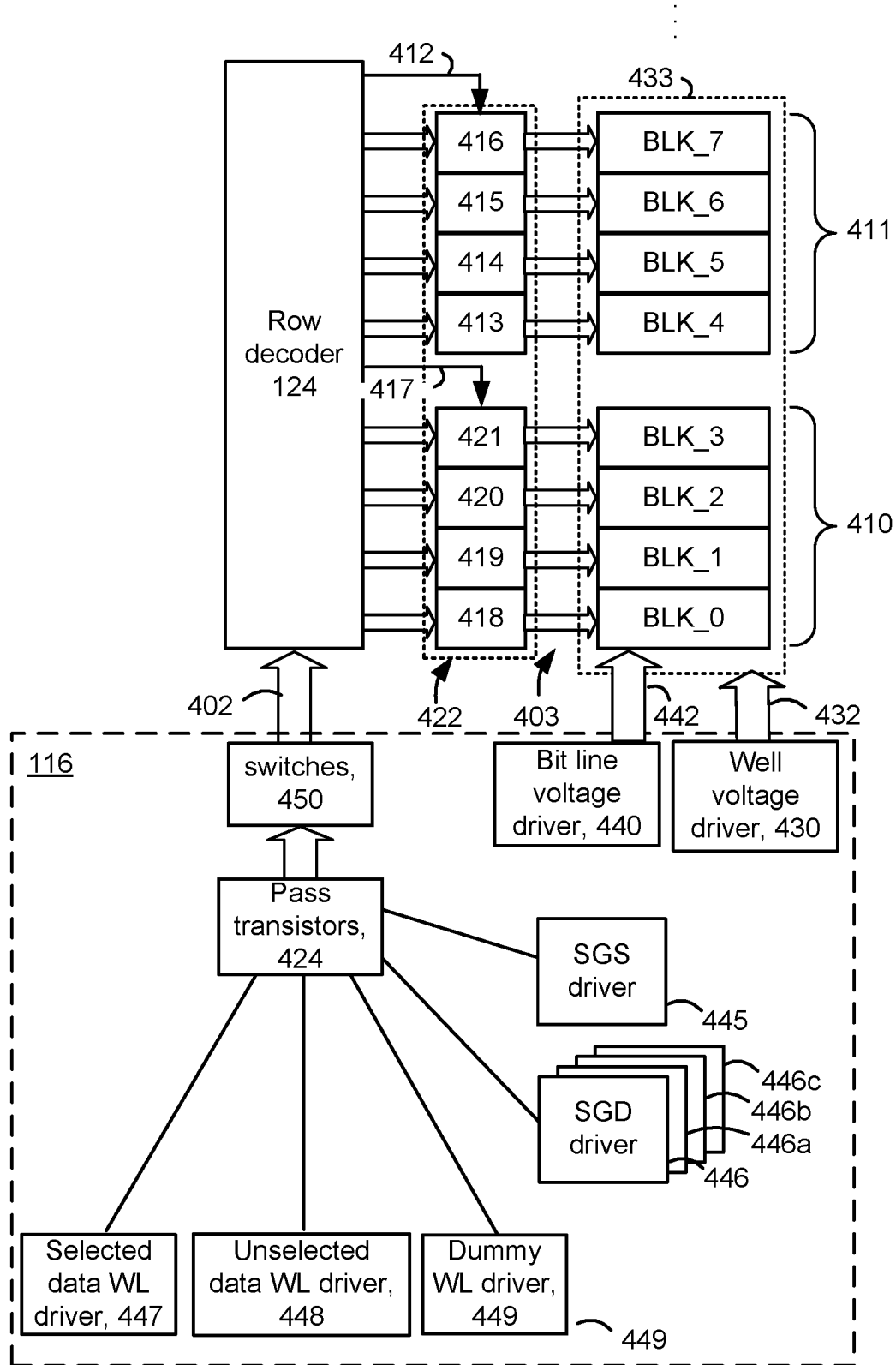
FIG. 3 depicts an example implementation of the power control module 116 of FIG. 1 for providing voltages to blocks of memory cells.

FIG. 3 depicts an example implementation of the power control module 116 of FIG. 1 for providing voltages to blocks of memory cells. In this example, the memory structure 126 includes a set 410 of four related blocks, BLK_0 to BLK_3, and another set 411 of four related blocks, BLK_4 to BLK_7. The blocks can be in one or more planes. The row decoder 124 of FIG. 1 provides voltages to word lines and select gates of each block via pass transistors 422. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on (conductive), a voltage from the row decoder is provided to the respective control gate lines or word lines. If the pass transistors are off (non-conductive), the row decoder is disconnected from the respective control gate lines or word lines so that the voltage floats on the respective control gate lines or word lines.

For instance, a control gate line 412 is connected to sets of pass transistors 413, 414, 415 and 416, which in turn are connected to control gate lines of BLK_4, BLK_5, BLK_6 and BLK_7, respectively. A control gate line 417 is connected to sets of pass transistors 418, 419, 420 and 421, which in turn are connected to control gate lines of BLK_0, BLK_1, BLK_2 and BLK_3, respectively.

Typically, program or read operations are performed on one selected block at a time and on one selected sub-block of the block. An erase operation may be performed on a selected block or sub-block. The row decoder can connect global control lines 402 to local control lines 403. The control lines represent conductive paths. Voltages are provided on the global control lines from a number of voltage drivers. Some of the voltage drivers may provide voltages to switches 450 which connect to the global control lines. Pass transistors 424 are controlled to pass voltages from the voltage drivers to the switches 450.

Figure 5A:
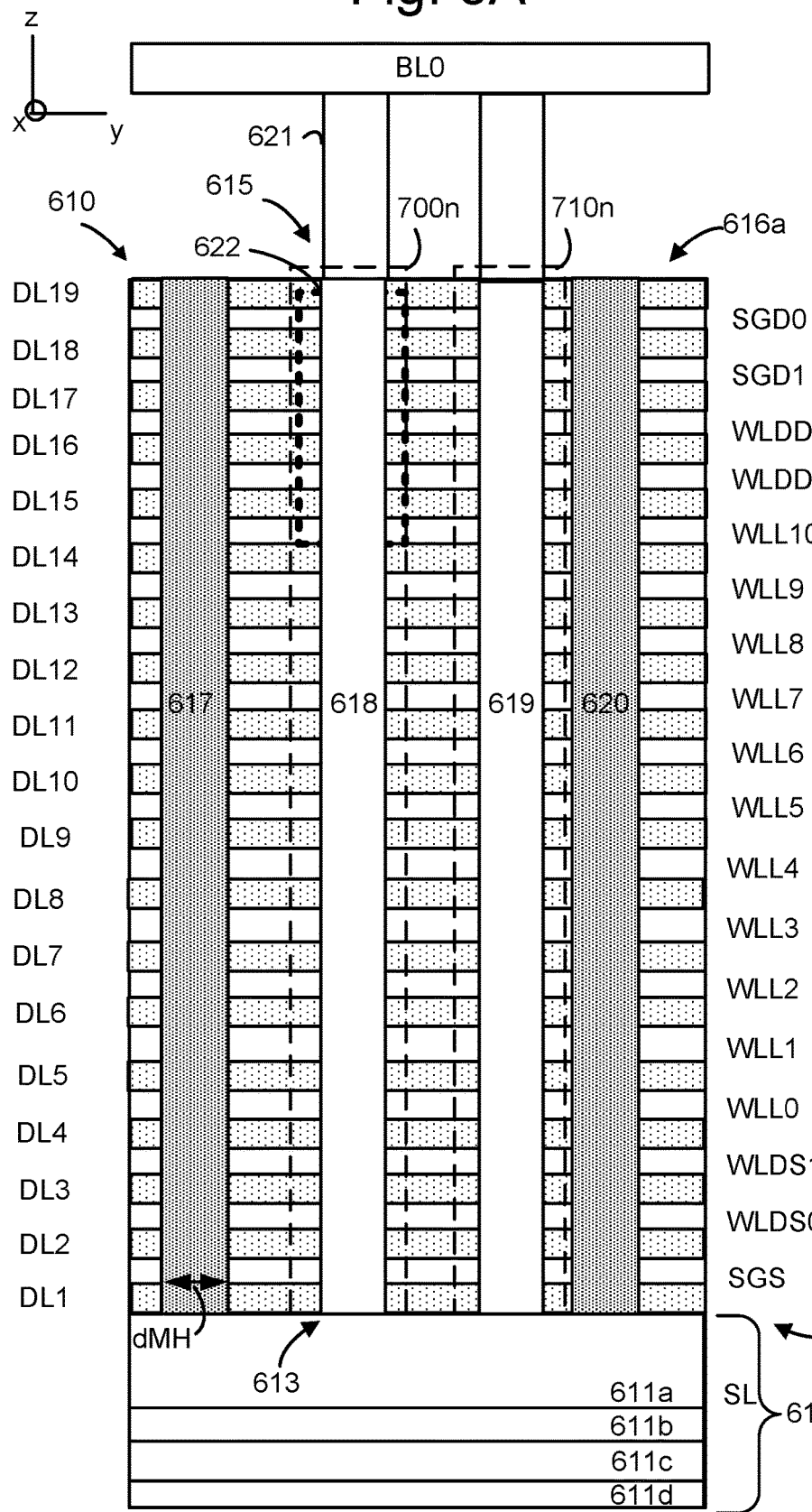
FIG. 5A depicts an example cross-sectional view of a portion of the block BLK0 of FIG. 4.

The voltage drivers can include a selected data word line (WL) driver 447, which provides a voltage on a data word line selected during a program or read operation, a driver 448 for unselected data word lines, and a driver for dummy word lines 449 (e.g., WLDD0, WLDD1, WLDS1 and WLDS0, respectively, in FIG. 5A).

Figure 7:
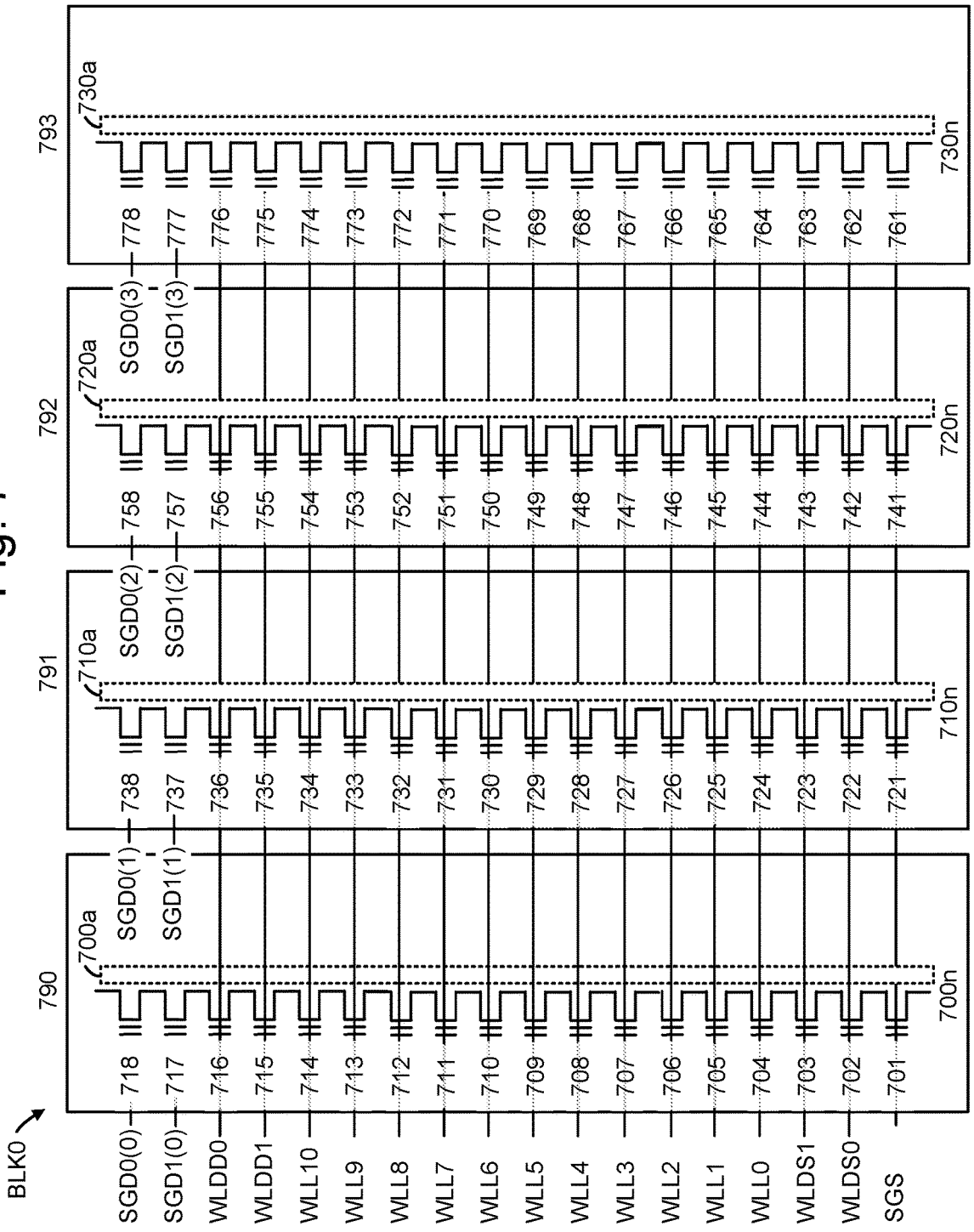
FIG. 7 depicts an example view of NAND strings in a block BLK0 which is consistent with FIGS. 4 and 5A.
Figure 8A:
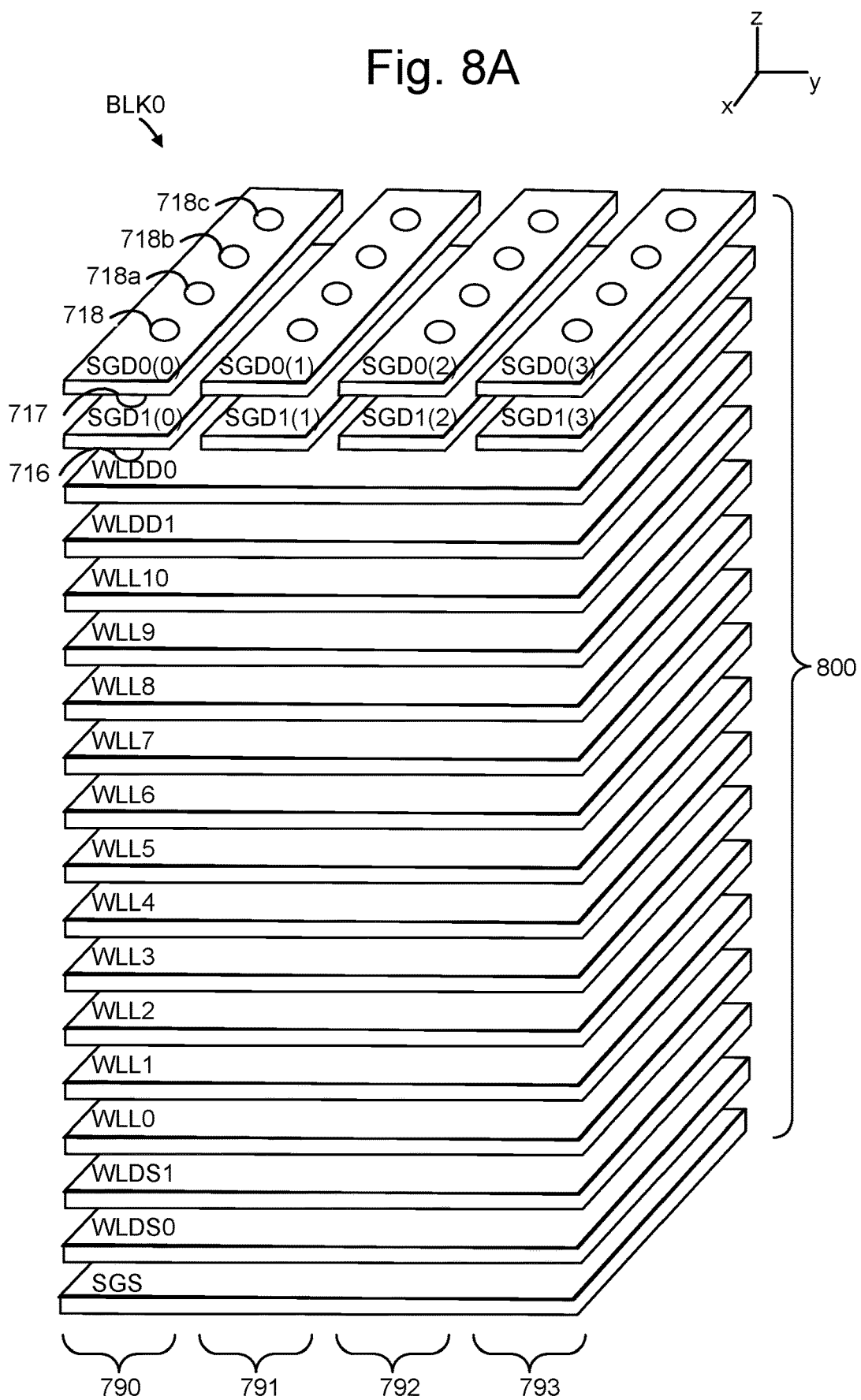
FIG. 8A depicts control gate layers in the block BLK0, consistent with FIG. 7.
Figure 8B:
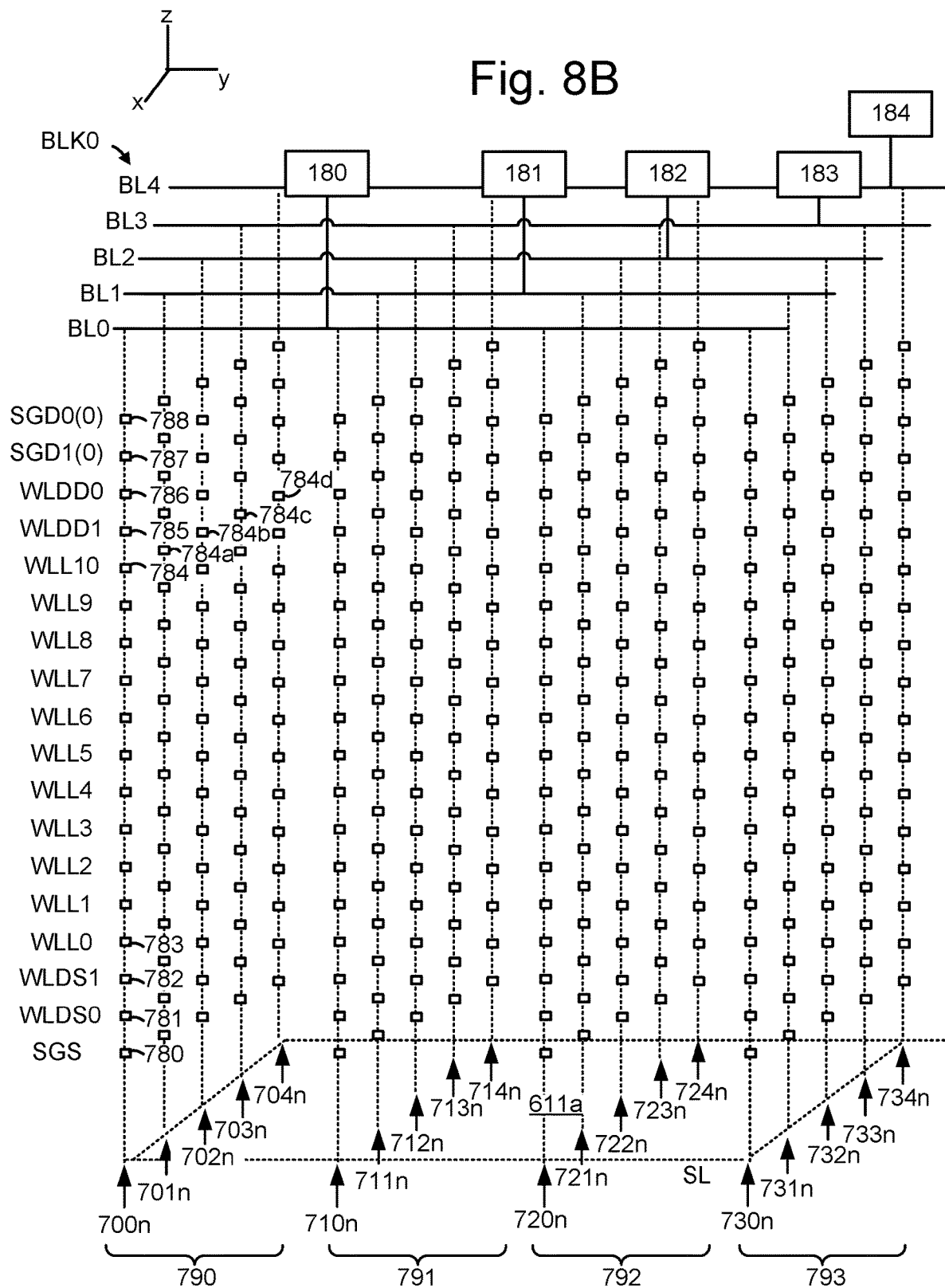
FIG. 8B depicts additional detail of the block BLK0 of FIG. 7.

The voltage drivers can also include an SGS driver 445 for a block, and separate SGD drivers 446, 446a, 446b and 446c for sub-blocks 790, 791, 792 and 793, respectively, such as in FIGS. 7, 8A and 8B. In other examples, the blocks of FIGS. 14A and 16A with seven or eight sub-blocks would have seven or eight SGD drivers, respectively.

Moreover, in some cases, there can be multiple SGD transistors, multiple SGS transistors, multiple drain side dummy memory cells and/or multiple source side dummy memory cells in each NAND string. To provide the greatest flexibility in programming these memory cells and transistors with program voltages or other word line specific parameters, there can be a separate driver for each select gate transistor and dummy memory cell in a NAND string, in one approach.

The various components, including the row decoder, may receive commands from a controller such as the state machine 112 or the controller 122 to perform the functions described herein.

In one approach, the well region 433 is common to the blocks and may be driven by a voltage driver 430 via a path 432. A set of bit lines 442 is also shared by the blocks. A bit line voltage driver 440 provides voltages to the bit lines. In a stacked memory device such as depicted in FIGS. 4 to 8B, sets of connected memory cells may be arranged in NAND strings which extend vertically upward from the substrate. The bottom (or source end) of each NAND string is in contact with the well region, and the top end (or drain end) of each NAND string is connected to a respective bit line, in one approach.

Figure 4:
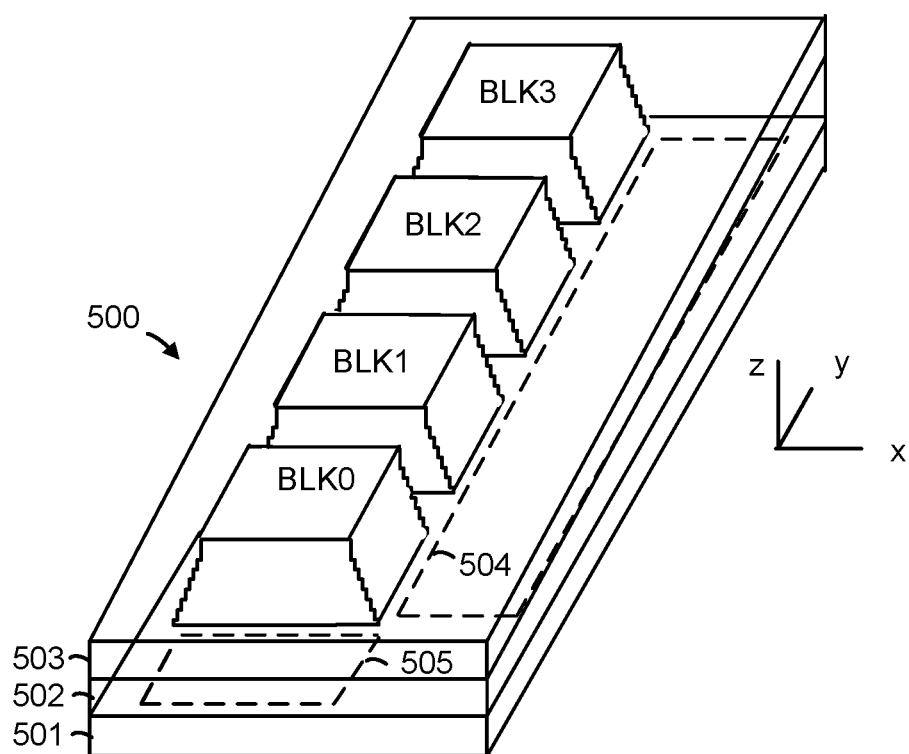
FIG. 4 is a perspective view of a memory device 500 comprising a set of blocks in an example 3D configuration of the memory structure 126 of FIG. 1.

FIG. 4 is a perspective view of a memory device 500 comprising a set of blocks in an example 3D configuration of the memory structure 126 of FIG. 1. On the substrate 501 are example blocks BLK0, BLK1, BLK2 and BLK3 of memory cells and peripheral areas with circuitry for use by the blocks. The peripheral area 504 runs along an edge of each block while the peripheral area 505 is at an end of the set of blocks. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

FIG. 5A depicts an example cross-sectional view of a portion of the block BLK0 of FIG. 4. The block comprises a stack 610 of alternating conductive and dielectric layers. In this example, the conductive layers comprise two SGD layers, one SGS layer, two source side dummy word line layers (or word lines) WLDS1 and WLDS0, two drain side dummy word line layers WLDD1 and WLDD0, and eleven data word line layers (or data word lines) WLL0-WLL10. WLL0 is a source side data word line and WLDS1 is a dummy word line layer which is adjacent to the source side data word line. WLDS0 is another dummy word line layer which is adjacent to WLDS1. WLL10 is a drain side data word line and WLDD1 is a dummy word line layer which is adjacent to the drain side data word line. WLDD0 is another dummy word line layer which is adjacent to WLDD1. The dielectric layers are labelled as DL1-1L19. Further, regions of the stack which comprise NAND strings 700$n$ and 710$n$ are depicted. Each NAND string encompasses a memory hole 618 or 619 which is filled with materials which form memory cells adjacent to the word lines. Region 622 of the stack is shown in greater detail in FIG. 6.

The stack includes a substrate 611. In one approach, a portion of the source line SL comprises a well region 611$a$ as an n-type source diffusion layer or well in the substrate. The well region is in contact with a source end of each string of memory cells in a block. An erase pulse may be applied to this layer in an erase operation The n-type well region 611$a$ is formed in a p-type well region 611$b$, which in turn is formed in an n-type well region 611$c$, which in turn is formed in a p-type semiconductor substrate 611$d$, in one possible implementation. The n-type source diffusion layer may be shared by all of the blocks in a plane, in one approach.

NAND string 700$n$ has a source-end 613 at a bottom 616$b$ of the stack 616 and a drain-end 615 at a top 616$a$ of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

A memory hole diameter, dMH, is also depicted. See FIG. 5C for further details.

Figure 5B:
FIG. 5B depicts an example transistor 650 in BLK0.

FIG. 5B depicts an example transistor 650 in BLK0. The transistor comprises a control gate CG, a drain D, a source S and a channel CH and may represent a memory cell or a select gate transistor, for example.

Figure 5C:
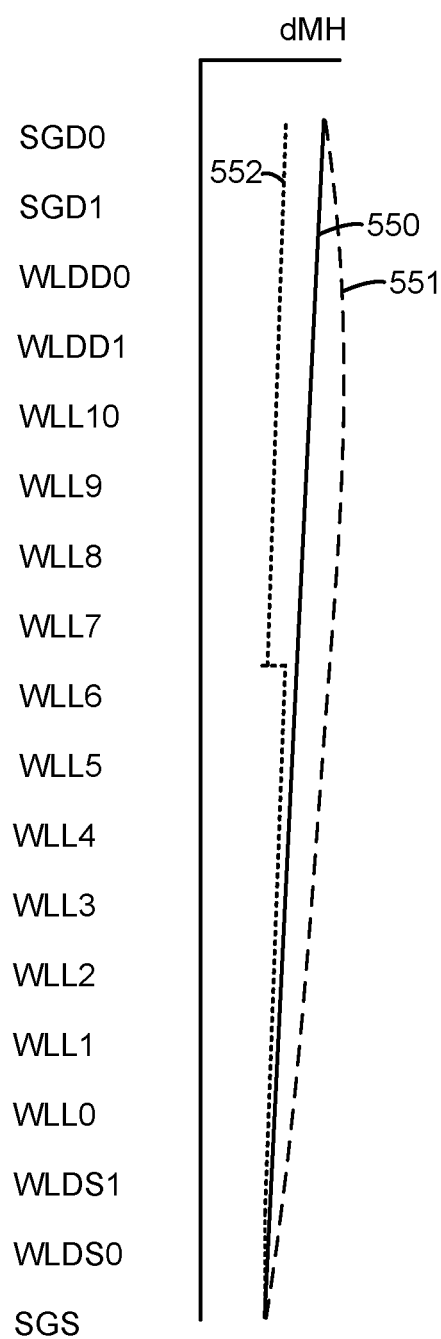
FIG. 5C depicts a plot of memory hole diameter in the stack of FIG. 5A.

FIG. 5C depicts a plot of memory hole diameter in the stack of FIG. 5A. The vertical axis depicts a diameter dMH of the memory holes and the pillars formed by materials in the memory holes. In such a memory device, the memory holes which are etched through the stack have a very high aspect ratio. For example, a depth-to-diameter ratio of about 25-30 is common. The memory holes may have a circular cross-section. Due to the etching process, the memory hole and resulting pillar width can vary along the length of the hole. Typically, the diameter becomes progressively smaller from the top to the bottom of the memory hole (plot 550). That is, the memory holes are tapered, narrowing at the bottom of the stack. In some cases, a slight narrowing occurs at the top of the hole near the select gate so that the diameter becomes slight wider before becoming progressively smaller from the top to the bottom of the memory hole (plot 551).

Due to the non-uniformity in the diameter of the memory hole and pillar, the programming and erase speed of the memory cells can vary based on their position along the memory hole. With a relatively smaller diameter portion of a memory hole, the electric field across the tunnel oxide is relatively stronger, so that the programming and erase speed is higher. This variation is in addition to the variation caused by different thicknesses of the blocking oxide layer.

In another possible implementation, represented by plot 552, the stack is fabricated in two tiers. The stack can be fabricated in two or more tiers. The bottom tier is formed first with a respective memory hole. The top tier is then formed with a respective memory hole which is aligned with the memory hole in the bottom tier. Each memory hole is tapered such that a double tapered memory hole is formed in which the width increases, then decreases and increases again, moving from the bottom of the stack to the top.

A program speed variation occurs due to the variation in the memory hole diameter, so that there is a program speed variation along the height of a NAND string. The memory cells may be grouped as depicted in FIG. 11C to 11E, where the memory hole diameter varies over a relatively small range for a group of adjacent memory cells, and the memory hole diameter varies over a relatively large range across different groups of adjacent memory cells. Memory cells within a group in one sub-block are expected to have a similar program speed and can therefore have a same optimized initial program voltage or other program parameter. Memory cells in different groups in one sub-block are expected to have different program speeds and can therefore have different optimized initial program voltages or other program parameter.

Figure 6:
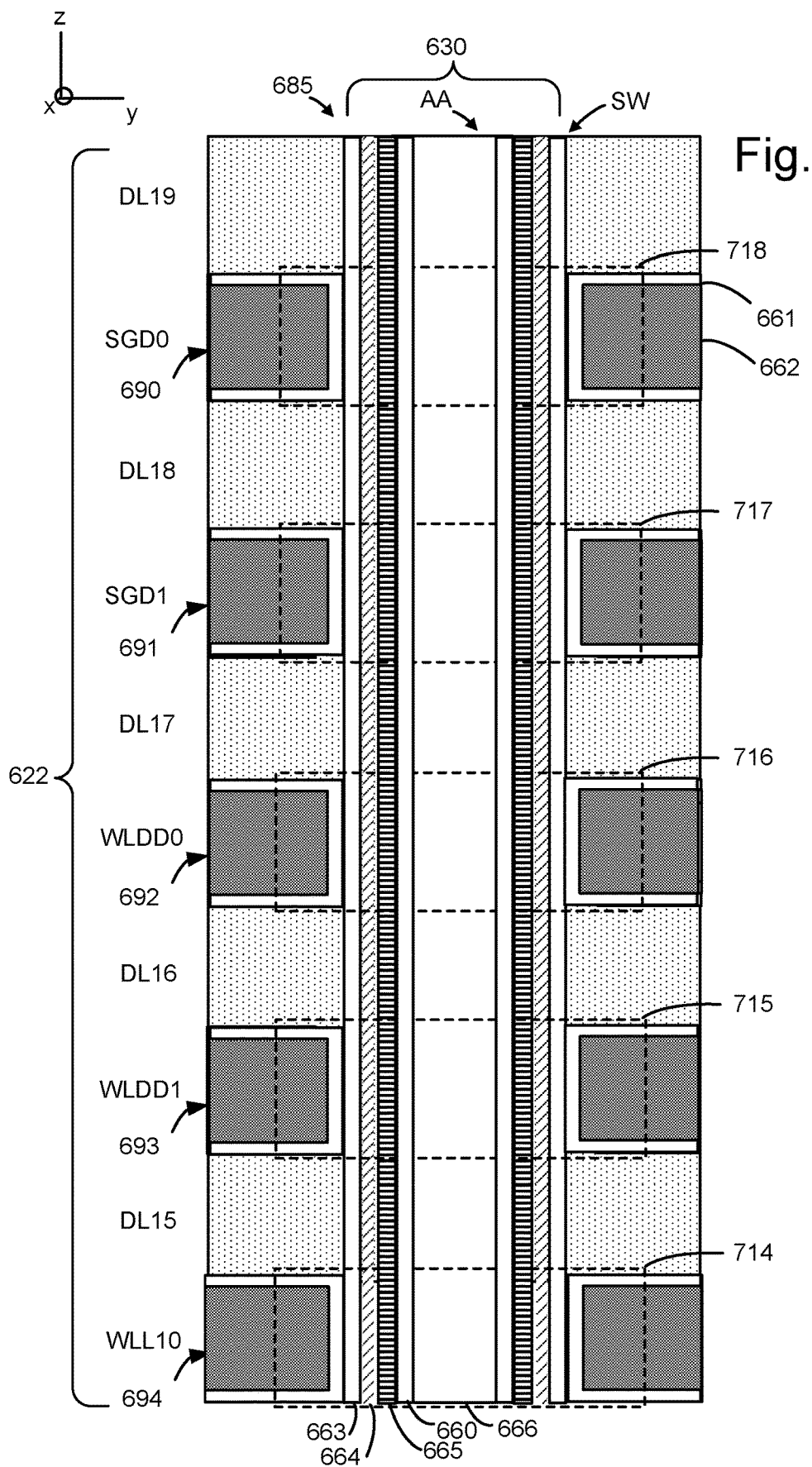
FIG. 6 depicts a close-up view of the region 622 of the stack of FIG. 5A.

FIG. 6 depicts a close-up view of the region 622 of the stack of FIG. 5A. Memory cells are formed at the different levels of the stack at the intersection of a word line layer and a memory hole. In this example, SGD transistors 718 and 717 are provided above dummy memory cells 716 and 715 and a data memory cell 714. These SGD transistors are at the drain end of the NAND string.

A number of layers can be deposited along the sidewall (SW) of the memory hole 630 and/or within each word line layer, e.g., using atomic layer deposition. For example, each pillar 685 or column which is formed by the materials within a memory hole can include a blocking oxide layer 663 (e.g., comprising SiO2), a charge-trapping layer 664 or film (e.g., comprising silicon nitride, Si3N4, or other nitride), a tunneling layer 665 (e.g., comprising a gate oxide), a channel 660 (e.g., comprising polysilicon), and a dielectric core 666 (e.g., comprising SiO2). A word line layer can include a metal barrier 661 and a conductive metal 662 such as Tungsten as a control gate. For example, control gates 690-694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

Each NAND string or set of connected transistors comprises a channel which extends continuously from one or more source-end select gate transistors to one or more drain-end select gate transistors. For example, the channels 700a, 710a, 720a and 730a extend continuously in the NAND strings 700n, 710n, 720n and 730n, respectively. The channel 700a extends continuously in the NAND strings 700n from the SGS transistor 701 to the SGD transistors 717 and 718. The channel 700a is continuous in that it is uninterrupted and can therefore provide a continuous conductive path in the NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 14C:
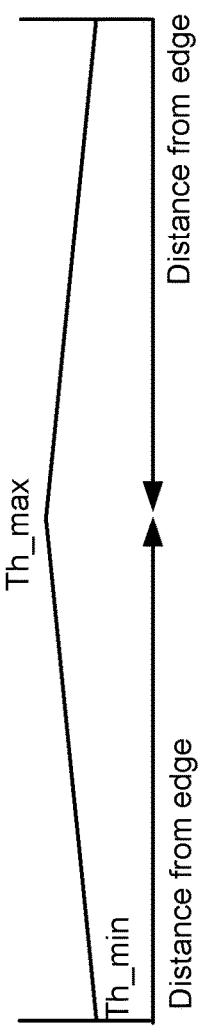
FIG. 14C depicts a plot showing a varying thickness of a blocking oxide layer in the block of FIG. 14B as a function of a distance from a nearest edge of the block.
Figure 14D:
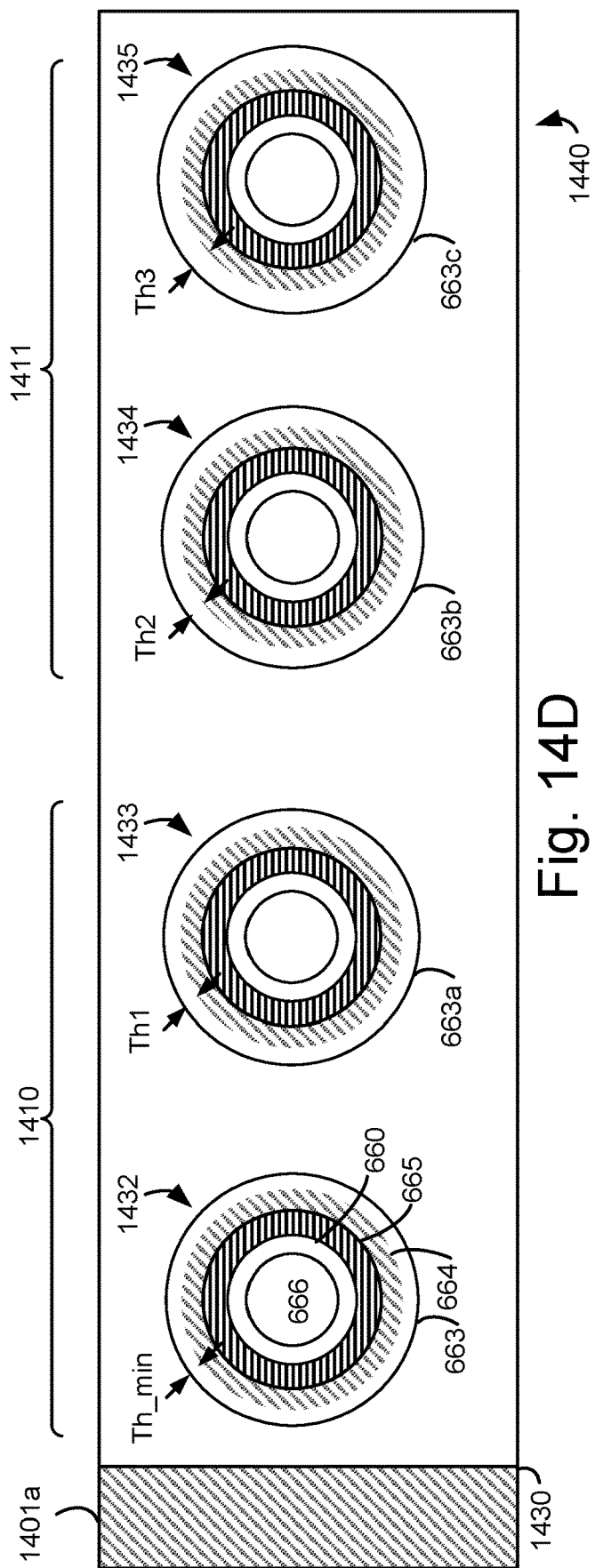
FIG. 14D depicts the region 1440 of FIG. 14A in further detail, showing the varying thickness of a blocking oxide layer.
Figure 16C:
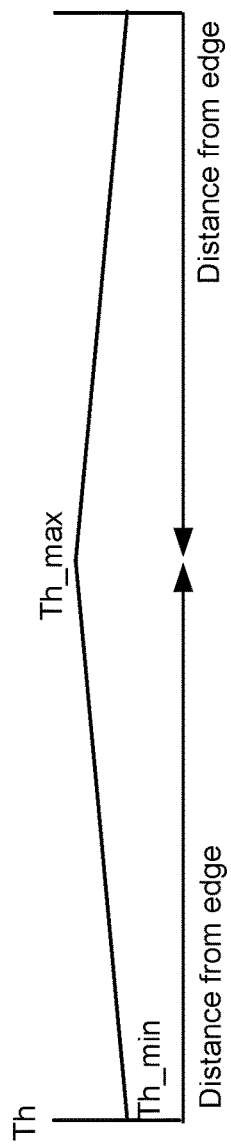
FIG. 16C depicts a plot showing a varying thickness of a blocking oxide layer in the block of FIG. 16B as a function of a distance from a nearest edge of the block.

As mentioned, the thickness of the blocking oxide layer can vary across a block as described further, e.g., in connection with FIGS. 14C, 14D and 16C.

FIG. 7 depicts an example view of NAND strings in the block BLK0 which is consistent with FIGS. 4 and 5A. The NAND strings are arranged in sub-blocks of the block in a 3D configuration. Each sub-block includes multiple NAND strings, where one example NAND string is depicted. For example, sub-blocks 790, 791, 792 and 793 comprise example NAND strings 700n, 710n, 720n and 730n, respectively. The NAND strings have data word lines, dummy word lines and select gate lines consistent with FIG. 5A. Each sub-block comprises a set of NAND strings which extend in the x direction and which have a common SGD line or control gate layer. The NAND strings may be arranged in multiple rows within each sub-block such as depicted in FIGS. 14B and 16B. Programming of the block may occur based on a word line programming order. One option is to program the memory cells connected to a selected word line in one sub-block before programming memory cells connected to the selected word line in other sub-blocks. The memory cells connected to the next word line are then programmed, one sub-block at a time. The word line programming order may start at WL0, the source-end word line and end at WLL10, the drain-end word line, for example. Programming thus can proceed one word line at a time and one sub-block at a time for each word line.

The NAND strings 700n, 710n, 720n and 730n have channels 700a, 710a, 720a and 730a, respectively.

Additionally, NAND string 700n includes SGS transistor 701, dummy memory cells 702 and 703, data memory cells 704-714, dummy memory cells 715 and 716, and SGD transistors 717 and 718.

NAND string 710n includes SGS transistor 721, dummy memory cells 722 and 723, data memory cells 724-734, dummy memory cells 735 and 736, and SGD transistors 737 and 738.

NAND string 720n includes SGS transistor 741, dummy memory cells 742 and 743, data memory cells 744-754, dummy memory cells 755 and 756, and SGD transistors 757 and 758.

NAND string 730n includes SGS transistor 761, dummy memory cells 762 and 763, data memory cells 764-774, dummy memory cells 775 and 776, and SGD transistors 777 and 778.

One or more SGD transistors are provided at the drain-end of each NAND string, and one or more SGS transistors are provided at the source-end of each NAND string. The SGD transistors in sub-blocks 790, 791, 792 and 793 may be driven by separate control lines SGD0(0) and SGD1(0), SGD0(1) and SGD1(1), SGD0(2) and SGD1(2), and SGD0(3) and SGD1(3), respectively, in one approach. In another approach, all of the SGD transistors in a sub-block are connected and commonly driven. The SGS transistors in sub-blocks 790, 791, 792 and 793 may connected to one another and commonly driven. In another approach, the SGS transistors are driven by separate control lines. This example includes four sub-blocks per block while FIG. 14A depicts seven sub-blocks per block and FIG. 16A depicts eight sub-blocks per block.

FIG. 8A depicts control gate layers in the block BLK0, consistent with FIG. 7. The control gate layers are arranged in a stack 800 and include dummy word lines layers or control gate layers WLDS0, WLDS1, WLDD0 and WLDD1, and data word line layers or control gate layers WLL0-WLL10, which are shared among the different sub-blocks 790-793. Each control gate layer can be a rectangular plate with a height in the z direction, a width in the y direction and a length in the z direction.

The control gate layers include a common SGS control gate layer for the block, and separate SGD control gate layers for each sub-block. For example, sub-block 790 includes SGD0(0) and SGD1(0), sub-block 791 includes SGD0(1) and SGD1(1), sub-block 792 includes SGD0(2) and SGD1(2), and sub-block 793 includes SGD0(3) and SGD1(3). Each SGD layer can be a rectangular plate with a height in the z direction, a width in the y direction and a length in the z direction. The width of the SGD plate is less than the width of the control gate layer plates. The length of the SGD plate can be the same as the length of the control gate layer plates. The height of the SGD plate can be the same as, or similar to, the height of the control gate layer plates.

Additionally, four example memory holes or NAND strings are depicted in each sub-block in a simplified example. SGD transistors 718, 718a, 718b and 718c are depicted in SGD0(0), SGD transistor 717 is depicted in SGD1(0) and dummy memory cell 716 is depicted in WLDD0. The sub-blocks of FIG. 14B and FIG. 16B each include 24 memory holes or NAND strings in another simplified example.

FIG. 8B depicts additional detail of the block BLK0 of FIG. 7. Example memory cells are depicted which extend in the x direction along word lines in each sub-block. Each memory cell is depicted as a square for simplicity. Sub-blocks 790, 791, 792 and 793 include NAND strings 700n-704n, 710n-714n, 720n-724n and 730n-734n, respectively. Bit lines are connected to sets of NAND strings. For example, a bit line BL0 is connected to NAND strings 700n, 710n, 720n and 730n, a bit line BL1 is connected to NAND strings 701n, 711n, 721n and 731n, a bit line BL2 is connected to NAND strings 702n, 712n, 722n and 732n, a bit line BL3 is connected to NAND strings 703n, 713n, 723n and 733n, and a bit line BL4 is connected to NAND strings 704n, 714n, 724n and 734n. Sense circuits may be connected to each bit line. For example, sense circuits 180-184 (similar to the sense circuits 60-63 of FIG. 2, for example) are connected to bit lines BL0-BL4, respectively.

Programming and reading can occur for selected cells in one word line and one sub-block at a time. This allows each selected cell to be controlled by a respective bit line and/or source line. For example, a set of memory cells, which includes an example memory cell 714, is connected to WLL10 in sub-block 790. This is the drain-end data word line. WLL0 is the source-end data word line. A set of memory cells may be programmed or read concurrently. An additional set of memory cells is connected to WLL10 in each of the other sub-blocks 791-793.

In this example, the source line SL or source region (well region 611a) is driven at a voltage Vsource.

Each NAND string includes one or more SGD transistors at the drain-end and one or more SGS transistors at the source end. In this case, there are two SGD transistors and one SGS transistor per string. Each SGD transistor may be connected to separate control line layer, as in FIG. 8A, so that it can be driven separately, or the two or more SGD transistors in a string may have their control gates connected and commonly driven.

The NAND string 700n includes SGD transistors 788 and 787 connected to select gate lines SGD0(0) and SGD1(0), respectively, dummy memory cells 786 and 785 connected to WLDD0 and WLDD1, respectively, and data memory cell 784 connected to WLL10. The NAND string 700n also includes an SGS transistor 780 connected to a select gate line SGS, dummy memory cells 781 and 782 connected to WLDS0 and WLDS1, respectively, and data memory cell 783 connected to WLL0. Data memory cells 784a, 784b, 784c and 784d in NAND strings 701n, 702n, 703n and 704n, respectively, are also connected to WLL10. For example, WLL10 may be a selected word line in a program operation, where the memory cells 784-784d are selected memory cells connected to the selected word line. BL0-BL5 are respective bit lines connected to the NAND strings 700n-704n, respectively.

FIG. 9A depicts a threshold voltage (Vth) distribution of a set of memory cells at the start of a program operation. The memory cells are initially in the erased (Er) state as represented by a Vth distribution 910. In an erase operation, the data memory cells transition from the Vth distributions of the programmed data states, e.g., states A-G, to the erased state. The erase operation can include multiple erase-verify loops. In each loop, the memory cells are biased for erasing after which an erase-verify test is performed. The erase-verify test can use an erase verify voltage, VvEr, which is applied to the word lines.

FIG. 9B depicts a Vth distribution of a set of memory cells after the program operation, showing the effects of over-programming. Multiple program loops are performed using a voltage signal such as in FIG. 10A, and verify tests are performed after each program pulse by applying one or more of the verify voltages VvA-VvG to the selected word line. The memory cells assigned to the Er state are not programmed and continue to be represented by the Vth distribution 910. The memory cells assigned to the A-G states (the programmed states) are programmed to the Vth distributions 911-917, respectively, in the case where the programming is optimized such as by using an optimum initial program voltage as described herein. The memory cells assigned to the A-G states are programmed to the Vth distributions 911a-917a, respectively, in the case where the programming is not optimized and over-programming occurs. When over-programming occur, the upper tail of the Vth distribution is increased to a degree which can result in read errors.

The memory cells which are programmed to the A, B, C, D, E, F and G states are subject to verify tests using the verify voltages of VvA, VvB, VvC, VvD, VvE, VvF and VvG, respectively.

Read voltages VrA, VrB, VrC, VrD, VrE, VrF and VrG can be used for reading the states of the memory cells in a read operation.

FIG. 9C depicts Vth distributions of memory cells of different sub-blocks being programmed to the A state to determine program speed. In this example, consistent with FIG. 14A, there are seven sub-blocks with four different program speeds represented by Vth distributions 920-923. After a given number of program loops are performed, the upper tail of the Vth distribution 923 exceeds the verify voltage VvA for a subset of the memory cells, e.g., 1% of the memory cells being programmed. This Vth distribution represents the sub-block with the highest program speed. The Vth distributions 922, 921 and 920, which represent the second, third and fourth highest program speeds, respectively, do not exceed VvA. For example, a subset of the memory cells represented by the Vth distributions 923, 922, 921 and 920 may exceed VvA after eight, nine, ten or eleven program loops, respectively. The number of program loops or the program voltage used to program a subset of memory cells of a sub-block above a specified verify voltage such as VvA, can be stored as an indication of the program speed of the memory cells. The stored program voltage is referred to as an acquired program voltage.

It is useful to use the verify test of a data state to determine the program speed since this approach does not require additional verify tests which would increase the program time. However, it is possible to perform a verify test using a voltage which is not a verify voltage of a data state, to determine program speed. For example, such a verify voltage could be lower or higher than VvA.

FIG. 10A depicts example voltage signals used in a program operation, including a voltage signal 1000 used in a program speed acquisition mode and voltage signal 1010 used in a normal program mode. The vertical axis depicts a voltage and the horizontal axis depicts time or a number of program loops (PLs). A program speed acquisition mode may be a type of program operation in which a goal is to program memory cells at a relatively slow speed to obtain a measurement of their program speed. The initial program voltage and step size used during the program speed acquisition mode can be lower than in the normal program mode. The relatively slow speed can be limited to a beginning portion of the program operation, in one approach.

The voltage signals 1000 and 1010 include a set of program voltages which are superimposed to show their relative magnitudes. The voltage signal 1000 includes a series of program pulses which are used for acquiring the program speed, starting with a program pulse 1001 in PL1 with a magnitude of Vpgm_init_low and ending with a program pulse 1003 in PL8. The voltage signal 1000 then includes a series of program pulses, starting with a program pulse 1004 in PL9 and ending with a program pulse 1005 in PL22, which are used for concluding the program operation with a normal program speed. The dotted line 1002 represents the relatively low step size used in PL1-PL8 and the dotted line 1006 represents the relatively high step size used in PL0-PL22.

The voltage signal 1010 includes a series of program pulses, starting with a program pulse 1011 in PL1 with a magnitude of Vpgm_init_SB and ending with a program pulse 1013 in PL17, which are used for the normal program mode. The dotted line 1012 represents the relatively high step size and can be the same as the step size represented by the dotted line 1006, in one approach.

Since the voltage signal 1000 include the slow programming of the program speed acquisition mode, the total number of program loops used to complete programming (22 program loops) is higher than for the voltage signal 1010, which does not include the program speed acquisition mode and which completes in 17 program loops, as an example.

The voltage signals are examples of incremental step pulse programming, where the program voltage is set to an initial level in an initial program loop and then stepped up in each successive program loop.

The verification signals in each program loop, including example verification signals 1014, can encompass lower assigned data states and then midrange assigned data states and then higher assigned data states as the program operations proceeds, as depicted in FIGS. 10B and 10C. The example verification signals depict three verify voltages as a simplification. A verification signal comprises a signal which is applied to a selected word line during a program loop after the application of a program voltage to the selected word line. The verification signal is part of a sensing operation. Memory cells are sensed during the application of the verification signal to judge their programming progress. A verification signal includes one or more voltages which are used to judge whether the memory cell has completed programming to an assigned data state. The result of sensing of the Vth relative to a verify voltage can be used to inhibit further programming of a memory cell.

The data which is programmed or read can be arranged in pages. For example, with four data states, or two bits per cell, two pages of data can be stored. An example encoding of bits for the Er, A, B and C states is 11, 10, 00 and 01, respectively, in the format of upper page (UP) bit/lower page (LP) bit. A lower page read may use VrA and VrC and an upper page read may use VrB.

With eight data states, or three bits per cell, three pages of data can be stored. An example encoding of bits for the A-G states is provided in FIG. 18. The data of the lower page can be determined by reading the memory cells using read voltages of VrA and VrE. The data of the middle page can be determined by reading the memory cells using read voltages of VrB, VrD and VrF. The data of the upper page can be determined by reading the memory cells using read voltages of VrC and VrG.

FIG. 10B depicts an example of the verification of different data states in the different program loops of FIG. 10A using the voltage signal 1010. The horizontal axis represents program loops and is aligned with the horizontal axis of FIG. 10A. The arrows overlap in some program loops, indicating that verify operations can be performed for multiple data states in the program loop. The arrows indicate that verify voltages for the A, B, C, D, E, F and G states are applied in verification signals in program loops 1-5, 3-7, 5-9, 7-11, 9-13, 11-15 and 13-17, respectively.

FIG. 10C depicts an example of the verification of different data states in the different program loops of FIG. 10A using the voltage signal 1000. The horizontal axis represents program loops and is aligned with the horizontal axis of FIG. 10A. The arrows overlap in some program loops, indicating that verify operations can be performed for multiple data states in the program loop. The arrows indicate that verify voltages for the A, B, C, D, E, F and G states are applied in verification signals in program loops 1-8, 6-10, 10-14, 13-17, 16-20 and 18-22, respectively.

The A state verification occurs in eight program loops compared to five program loops in FIG. 10B. This is due to the reduced step size used while in the program speed acquisition mode. The Vth of the memory cells increases in relatively small increments so that relatively small differences in program speed can be detected such as depicted in FIG. 9C.

The number of program loops used for the verification of the B-G states is the same in FIGS. 10B and 10C in these examples since the step size is the same.

As mentioned, it is useful to use the verify test of a data state to determine the program speed since this approach does not require additional verify tests which would increase the program time. Moreover, it is useful to use the verify test of the lowest programmed data state (e.g., the A state) to determine the program speed since this allows the program operation to transition from the relative slow program speed of the program speed acquisition mode to a normal program speed to minimize the program time penalty.

FIG. 11A1 depicts a flowchart of an example program operation in which a program speed is acquired from one or more sub-blocks and used to determine an initial program voltage for another sub-block. At step 1100, a command is received to perform a program operation for a block. Step 1101 includes determining a program speed of one or more sub-blocks of the block. Step 1102 includes determining an initial program voltage (Vpgm) of another sub-block of the block based on the acquired program speed. Step 1103 includes programming memory cells of the another sub-block using the initial Vpgm.

FIG. 11A2 depicts a flowchart of an example implementation of FIG. 11A1 for groups of word lines. FIG. 11C, for example, shows how a block can be divided into four groups of word lines, group1-group4. The memory cells in each group are considered to have a similar program speed so that an acquired program speed for memory cells of one word line in a group is representative of the program speeds for memory cells of other word lines in the group. Similarly, an initial Vpgm or other program parameter which is determined to be optimal for memory cells of one word line in a group is also optimal for memory cells of other word lines in the group.

Step 1104 involves selecting a group of word lines of a block, such as group1. Each group can be selected in turn. Step 1105 includes determining a program speed of memory cells of a selected word line in the group, for one or more sub-blocks. For example, the program speed can be determined from memory cells connected to WL0 in SB0. Step 1106 includes determining an initial program voltage (Vpgm) based on the acquired program speed. Step 1107a includes programming memory cells of remaining word lines in the group in the one or more sub-blocks using the initial Vpgm. Step 1107b includes programming memory cells of all word lines in the group in remaining sub-blocks of the block using the initial Vpgm. Thus, once the initial Vpgm is acquired from some memory cells in a group, it can be used in programming the remaining memory cells in the group. A decision step 1108 determines if there is a next group of word lines to program. If the decision step is false, the process is done at step 1109. If the decision step is true, a next group is selected at step 1104.

As an example, for group0, the program speed can be determined for the memory cells connected to WL0 in SB0 and Vpgm_init_group1 can be determined based on this program speed. The memory cells connected to WL1 and WL2 in SB0, and the memory cells connected to WL0-WL2 in SB1-SB6 can then be programmed using Vpgm_init_group1.

Subsequently, for group2, the program speed can be determined for the memory cells connected to WL3 in SB0 and Vpgm_init_group2 can be determined based on this program speed. The memory cells connected to WL4 and WL5 in SB0, and the memory cells connected to WL3-WL5 in SB1-SB6 can then be programmed using Vpgm_init_group2.

Subsequently, for group3, the program speed can be determined for the memory cells connected to WL6 in SB0 and Vpgm_init_group3 can be determined based on this program speed. The memory cells connected to WL7 and WL8 in SB0, and the memory cells connected to WL6-WL8 in SB1-SB6 can then be programmed using Vpgm_init_group3.

Subsequently, for group4, the program speed can be determined for the memory cells connected to WL9 in SB0 and Vpgm_init_group4 can be determined based on this program speed. The memory cells connected to WL10 in SB0, and the memory cells connected to WL9 and WL10 in SB1-SB6 can then be programmed using Vpgm_init_group4.

Note that the program speed for the memory cells connected to a word line in a sub-block can be determined based on sensing the memory cells in all rows of the sub-block, or in one or more rows of the sub-block. See also FIG. 11I which refer to row-based sensing.

FIG. 11B depicts a flowchart of a first example implementation of the process of FIG. 11A1 in which a table such as in FIG. 11C-11E is accessed to determine an optimized initial Vpgm for a sub-block based on the selected word line and the selected sub-block. This implementation involves preparing a table with offset voltages cross-referenced to sub-block and word line or group of word lines. The table can be prepared based on program speed tests at the time of manufacture, for instance. A table can be shared by multiple blocks of a memory device, in one approach. Or, each block can have a separate table. At step 1110, a command is received to perform a program operation for a selected word line of a block. Step 1111 includes programming memory cells connected to the selected word line in a sub-block in a program speed acquisition mode and storing an acquired Vpgm indicating the program speed. This can be a first-programmed sub-block of the block, for example. Step 1112 includes accessing a table to determine an offset voltage based on the selected word line and a next sub-block to be programmed. See the example tables of FIG. 11C to 11E. Step 1113 includes determining an initial Vpgm based on a sum of the offset voltage and the acquired Vpgm of the selected word line. Step 1114 includes programming memory cells connected to the selected word line in the next sub-block using the initial Vpgm. A decision step 1115 determines if there is a next sub-block to program, e.g., for the currently selected word line. If the decision step is false, the process is done at step 1116. If the decision step is true, the table is again accessed at step 1112 to determine an offset voltage for the next sub-block to be programmed.

This approach is useful because the program speed is acquired from one sub-block rather than two so that a program time penalty is minimized. Moreover, the process adapts to changes in the performance of the memory device over time. For example, the acquired Vpgm may decrease over time as program-erase (P-E) cycles accumulate and the memory cells becomes degraded and easier to program. The acquired Vpgm may also change due to environmental factors such as changes in temperature. The same offset values in the table can be used as the number of P-E cycles increases or as the temperature changes. The optimized initial Vpgm thus changes as the acquired Vpgm changes without the need to adjust the offset values, or provide additional offset values, based on P-E cycles or temperature. Optionally, the offset values could be adjusted based on P-E cycles or other factors such as temperature.

In one approach, the process of FIG. 11B can be repeated for each selected word line. However, it is more efficient to perform step 1111 once for a group of word lines, and the tables of FIG. 11C to 11E are based on this approach.

FIG. 11C depicts an example table for use in the process of FIG. 11B for an example block with seven sub-blocks SB0-SB6, consistent with FIG. 14A, where the program speed is acquired from SB0 as the first sub-block in step 1111 of FIG. 11B. The word lines are arranged in groups which have a similar program speed due to a similar memory hole diameter, as discussed in connection with FIG. 5C. The groups include group1, group2, group3 and group4 comprising WL0-WL2, WL3-WL5, WL6-WL8 and WL9-WL10, respectively, consistent with FIG. 5C, as an example.

SB6 has a same program speed as SB0 so that the offset is 0 V. SB1 and SB5 have a slightly slower program speed than SB0 so that the offsets are relatively small, ranging from 0.1-0.4 V. SB2 and SB4 have a moderately slower program speed than SB0 so that the offsets are moderate, ranging from 0.2-0.8 V. SB3, the central sub-block, has a significantly slower program speed than SB0 so that the offset is relatively large, ranging from 0.3-1.2 V. The offsets are largest for the top group of memory cells (group4), where the memory hole diameter is greatest and the program speed is slowest in a sub-block.

FIG. 11D depicts an example table for use in the process of FIG. 11B for an example block with seven sub-blocks SB0-SB6, consistent with FIG. 14A, where the program speed is acquired from SB1. If the programming of a given block is interrupted such as by programming of another block, the program speed of step 1111 of FIG. 11B can be obtained again from the currently programmed sub-block of the given block. For example, the interruption may occur after SB0 is programmed and before SB1 is programmed. The acquired Vpgm from SB0 may be overwritten in this case by an acquired Vpgm from the other block. In this case, it can be useful to have a table in which the offset voltages are relative to SB1 or sub-blocks other than the first-programmed sub-block. An interruption can also occur when there is a power reset or partial word line programming.

SB0 and SB6 have a slightly faster program speed than SB1 so that the offset are relatively small, ranging from −0.1 to −0.4 V. SB5 has a same program speed as SB1 so that the offset is 0 V. SB2 and SB4 have a slightly slower program speed than SB1 so that the offsets are relatively small, ranging from 0.1-0.4 V. SB3 has a moderately slower program speed than SB1 so that the offsets are moderate, ranging from 0.2-0.8 V. The offset is a positive voltage for a sub-block which has a lower program speed than the sub-block of the acquired program speed. The offset is a negative voltage for a sub-block which has a higher program speed than the sub-block of the acquired program speed.

FIG. 11E depicts an example table for use in the process of FIG. 11B for an example block with eight sub-blocks SB0-SB7, consistent with FIG. 16A, where the program speed is acquired from SB0. SB7 has a same program speed as SB0 so that the offset is 0 V. SB1 and SB6 have a slightly slower program speed than SB0 so that the offsets are relatively small, ranging from 0.1-0.4 V. SB2 and SB5 have a moderately slower program speed than SB0 so that the offsets are moderate, ranging from 0.2-0.8 V. SB3 and SB4 have a significantly slower program speed than SB0 so that the offset is relatively large, ranging from 0.3-1.2 V.

In FIG. 11C-11E, a control circuit is configured to look up an offset voltage based on a first program voltage and the position of another sub-block of the block, and to add the offset voltage to the first program voltage to obtain an initial program voltage for the another sub-block.

In one implementation, a plurality of memory cells are connected to a set of word lines, the memory cells of one sub-block and the memory cells of another sub-block are connected to a word line among the set of word lines, and a control circuit is configured to look up the offset voltage based on a position of the word line among the set of word lines. The position of the word line may be indicated by the group of word lines it is in.

Figure 11F:
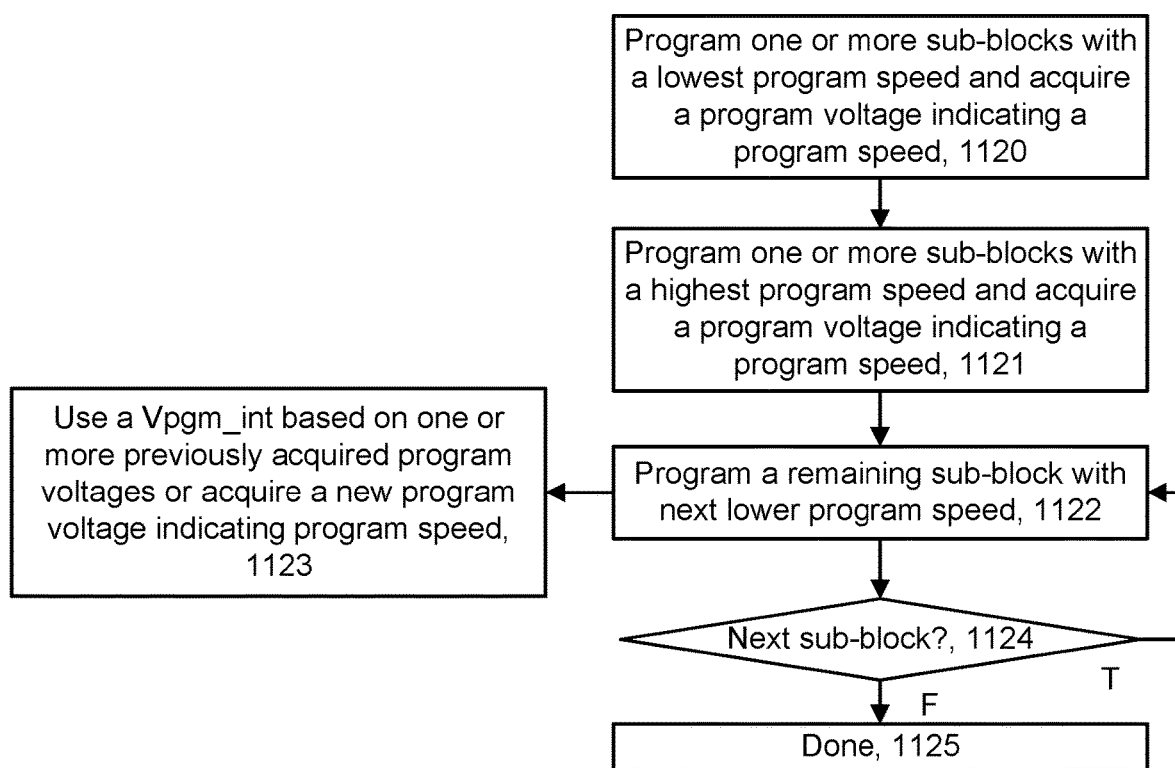
FIG. 11F depicts a flowchart of a second example implementation of the process of FIG. 11A1 in which sub-blocks are programmed in an order which is based on their program speeds.

FIG. 11F depicts a flowchart of a second example implementation of the process of FIG. 11A1 in which sub-blocks are programmed in an order which is based on their program speeds. Step 1120 includes programming one or more sub-blocks with a lowest program speed in the block and acquiring a program voltage indicating a program speed. For example, the sub-block with a lowest program speed in a block is typically the central sub-block or sub-blocks since they are furthest from the edge of the blocks at which the etchant is introduced, and will therefore have the thickest blocking oxide layer.

Step 1121 includes programming one or more sub-blocks with a highest program speed in the block and acquiring a program voltage indicating a program speed. For example, the sub-block with a highest program speed in a block is typically the edge sub-block or sub-blocks since they are closest to the edge of the blocks at which the etchant is introduced, and will therefore have the thinnest blocking oxide layer.

Step 1122 includes programming a remaining sub-block with a next lower program speed, e.g., lower than a previously-programmed block. The remaining sub-blocks of a block (e.g., sub-blocks other than the sub-blocks with the lowest and highest program speeds in the block, that is, sub-blocks with a program speed between the highest and lowest program speeds) can be programmed in a reverse order of their program speed, e.g., programming the remaining sub-blocks with the highest program speed first and remaining sub-blocks with successively lower program speeds successively later.

Step 1123 includes using a Vpgm_init based on one or more previously acquired program voltages, if available, or acquiring a new program voltage indicating program speed, in connection with step 1122. Vpgm_init can be based on interpolation between acquired program voltages of the sub-blocks with the highest and lowest program speed, as described in connection with FIG. 11G, if these acquired program voltages are available at the start of programming of a remaining sub-block. See the example of FIG. 13A. Vpgm_init can be based on the acquired program voltage of the sub-block with the highest program speed if this acquired program voltage (but not other previously-acquired program voltages such as the acquired program voltage of the sub-block with the lowest program speed) is available at the start of programming of a remaining sub-block. See the example of FIG. 13B. Vpgm_init can be based on the acquired program voltage of a previously-programmed remaining sub-block if this acquired program voltage (but not other previously-acquired program voltages) is available at the start of programming of a later-programmed remaining sub-block. See the example of FIG. 13B.

A decision step 1124 determines if there is a next sub-block to program. If the decision step is false, the process is done at step 1125. If the decision step is true, programming of a next remaining sub-block begins at step 1123.

For example, in FIG. 14A, sub-block 1413 has the lowest program speed and is programmed first, sub-blocks 1410 and 1416 have the highest program speed and are programmed next, e.g., sub-block 1410 followed by sub-block 1416, or sub-block 1416 followed by sub-block 1410. The remaining sub-blocks are sub-blocks 1411, 1412, 1414 and 1415. Sub-blocks 1411 and 1415 have a next lower program speed after sub-blocks 1410 and 1416 and are programmed next, e.g., sub-block 1411 followed by sub-block 1415, or sub-block 1415 followed by sub-block 1411. Sub-blocks 1412 and 1414 have the next lower program speed after sub-blocks 1411 and 1415 and are programmed next, e.g., sub-block 1412 followed by sub-block 1414, or sub-block 1414 followed by sub-block 1412.

In FIG. 16A, the program order can be: sub-blocks 1613 and 1614, sub-blocks 1610 and 1617, sub-blocks 1611 and 1616, and finally sub-blocks 1612 and 1615.

The sub-blocks with the lowest and highest program speeds in a block can be programmed in a program speed acquisition mode to obtain an acquired Vpgm indicating the program speed. For a later programmed, remaining sub-block, an initial Vpgm can be determined based on the acquired Vpgm of an earlier-programmed sub-block, if the data representing the acquired Vpgm is still available in a storage location, and the remaining sub-block programmed in a normal program mode. If the data representing the acquired Vpgm is not still available, the later programmed sub-block can be programmed in a program speed acquisition mode to obtain a new acquired Vpgm. The new acquired Vpgm can be used to determine an initial Vpgm for one or more remaining sub-blocks of the block.

Thus, in one implementation of step 1122, the remaining sub-blocks can all be programmed with the same Vpgm_init if it remains available in the storage location during the programming of the remaining sub-blocks. If a previously-stored Vpgm_init is no longer available, a new Vpgm_init is determined, and the remaining sub-blocks can all be programmed with the new Vpgm_init if it remains available in the storage location during the programming of the remaining sub-blocks.

The process of FIG. 11F ensures that the initial Vpgm for a given remaining sub-block is determined from a prior programmed sub-block having a higher program speed. As a result, the initial Vpgm for the given remaining sub-block is relatively low and avoids over-programming.

In one option, an initial Vpgm is determined once for programming a group of word lines in a sub-block rather than once for every word line in a sub-block.

In another option, step 1120 is omitted. In this case, the programming of all sub-blocks in a block occurs in a reverse order of their program speed. For example, in FIG. 14A, the program order can be: sub-blocks 1410 and 1416, sub-blocks 1411 and 1415, sub-blocks 1412 and 1414, and finally sub-block 1413. In FIG. 16A, the program order can be: sub-blocks 1610 and 1617, sub-blocks 1611 and 1616, sub-blocks 1612 and 1615, and finally sub-blocks 1613 and 1614.

Figure 11G:
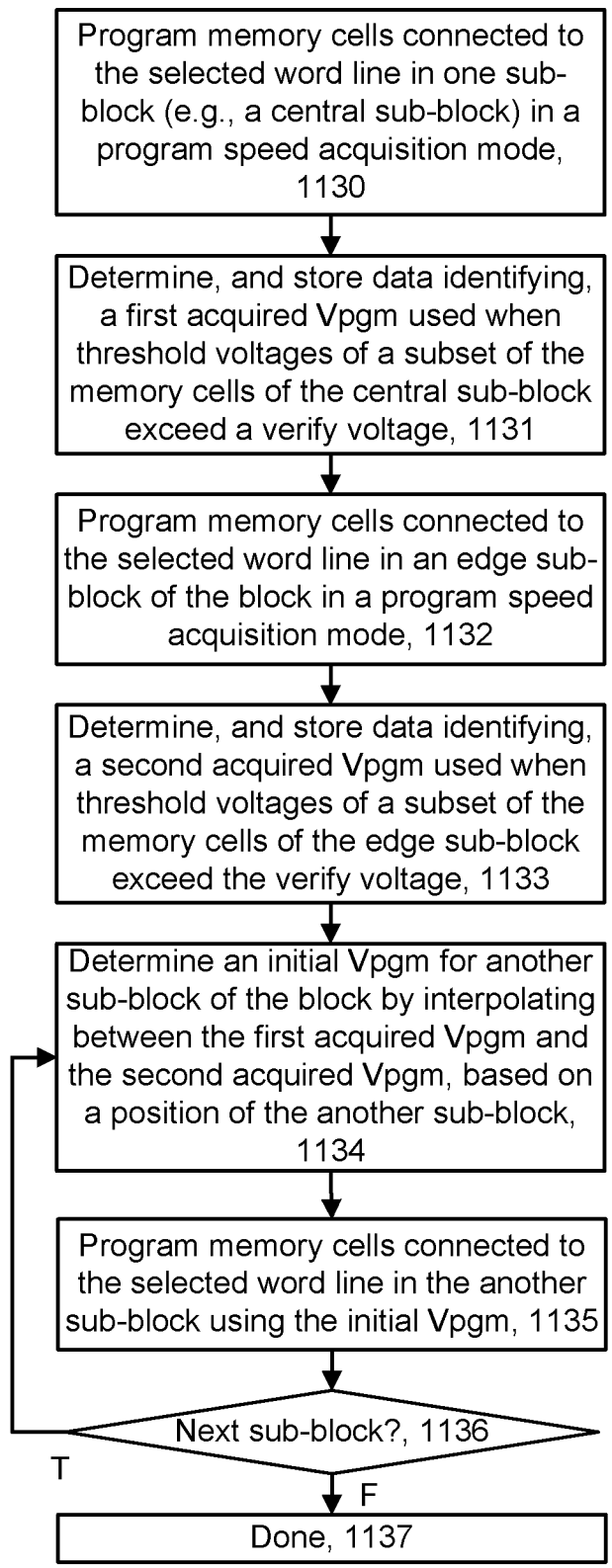
FIG. 11G depicts a flowchart of an example implementation of the process of FIG. 11F in which acquired program voltages from central and edge sub-blocks are used to determine an initial Vpgm for another sub-block.

FIG. 11G depicts a flowchart of an example implementation of the process of FIG. 11F in which acquired program voltages from central and edge sub-blocks are used to determine an initial Vpgm for another sub-block. Step 1130 includes programming memory cells connected to the selected word line in one sub-block (e.g., a central sub-block) in a program speed acquisition mode. Step 1131 includes determining, and store data identifying, a first acquired Vpgm (a first program voltage) used when threshold voltages of a subset of the memory cells of the central sub-block exceed a verify voltage. See FIG. 9C. Step 1132 includes programming memory cells connected to the selected word line in an edge sub-block of the block in a program speed acquisition mode. Step 1133 includes determining, and store data identifying, a second acquired Vpgm (a second program voltage) used when threshold voltages of a subset of the memory cells of the edge sub-block exceed the verify voltage. Step 1134 includes determining an initial Vpgm for another of the sub-blocks of the block by interpolating between the first acquired Vpgm and the second acquired Vpgm, based on a position of the another sub-block. See FIGS. 13A, 15B and 17B.

The another sub-block may be between the one sub-block (e.g., sub-block 1413) and an edge sub-block (e.g., sub-block 1410 or 1416 in FIG. 14A, or sub-block 1610 or 1617 in FIG. 16A) of the block. Moreover, there may be multiple sub-blocks (e.g., sub-block 1411, 1412, 1414 or 1415 in FIG. 14A, or sub-block 1611, 1612, 1615 or 1616 in FIG. 16A) comprising the another sub-block between the one sub-block and the edge sub-block. The interpolation between the first program voltage and the second program voltage is based on the position of the another sub-block among the multiple sub-blocks.

Step 1135 includes programming memory cells connected to the selected word line in the another sub-block using the initial Vpgm. A decision step 1136 determines if there is a next sub-block to program. If the decision step is false, the process is done at step 1137. If the decision step is true, the process is repeated at step 1134.

In FIG. 14A, the central sub-block is sub-block 1413 and the edge sub-blocks are sub-blocks 1410 and 1416. In FIG. 16A, the central sub-blocks are sub-blocks 1613 and 1614 and the edge sub-blocks are sub-blocks 1610 and 1617.

Once the first and second program voltages are acquired and as long as they are available in a storage location, Vpgm_init can be optimized for each of the remaining sub-blocks. If the first acquired Vpgm, or the first and second acquired program voltages are no longer available in the storage location due to an interruption in the programming of a block, a new program voltage can be acquired to determine a new Vpgm_init, as discussed in connection with FIG. 11F.

Figure 11H:
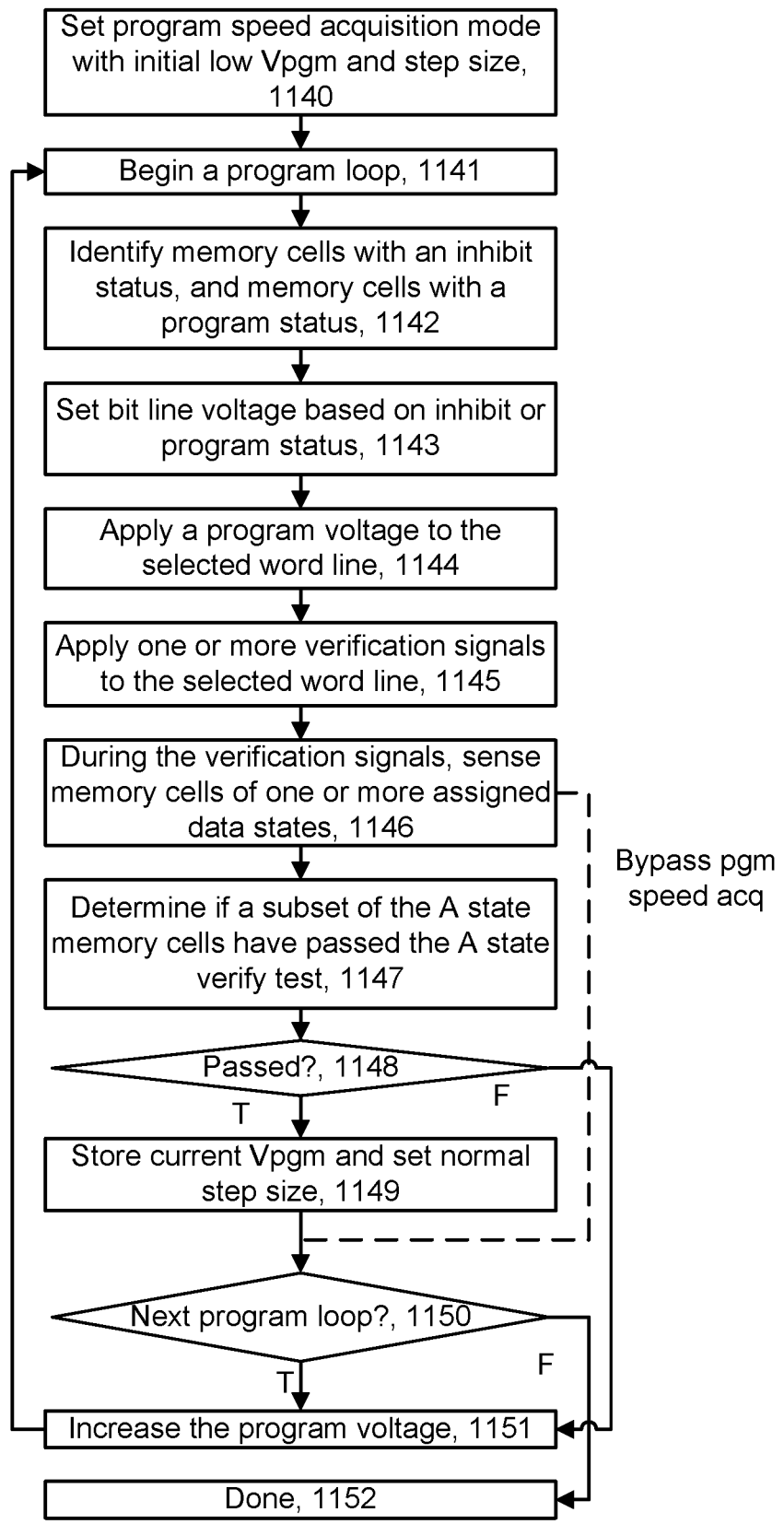
FIG. 11H depicts a flowchart of an example program operation for a sub-block using a program speed acquisition mode, consistent with the voltage signal 1000 of FIG. 10A.
Figures 18, 19:
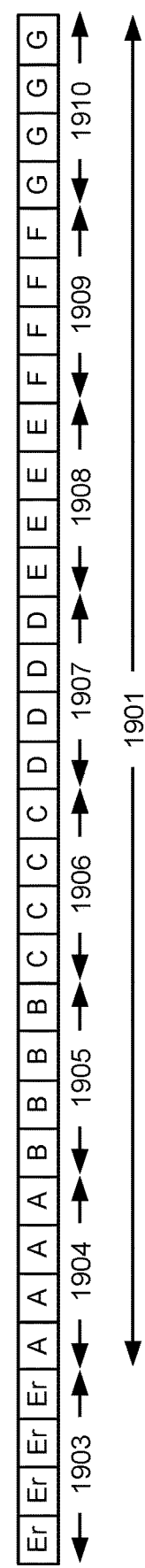
FIG. 18 depicts example values in the latches of FIG. 2 during a program operation, consistent with step 1142 of FIG. 11H and step 1182 of FIG. 11K.
FIG. 19 depicts an example set of memory cells connected to a word line selected for programming, where eight data states are used.

FIG. 11H depicts a flowchart of an example program operation for a sub-block using a program speed acquisition mode, consistent with the voltage signal 1000 of FIG. 10A. Step 1140 sets a program speed acquisition mode with an initial low Vpgm and step size. Step 1141 begins a program loop. Step 1142 includes identifying memory cells with an inhibit status, and memory cells with a program status. For example, the bit sequences in the latches may be read as depicted in FIG. 18 to identify the memory cells assigned to the Er state and the memory cells assigned to the A-G states. Step 1143 includes setting a bit line voltage based on the inhibit or program status (e.g., 2-3 V or 0 V, respectively). Step 1144 includes applying a program voltage or pulse to the selected word line while the bit line voltages are set as in step 1143. Step 1145 includes applying one or more verification signals to the selected word line. See the example verification signals 1014 in FIG. 10A. The verification signal comprises a verification voltage such as VvA, such as depicted in FIG. 10C. Step 1146 includes, during the verification signals, sensing the memory cells of one or more assigned data states. The sensing of a memory cell during a verification signal is a verify test since it tests the Vth of the memory cell relative to the voltage of the verification signal. In a given program loop, verify tests may be performed on a subset of the memory cells with the program status as discussed, e.g., in connection with FIG. 10C.

Step 1147 determines if a subset of the A state memory cells have passed the A state verify test. If they have passed, a decision step 1148 is true and step 1149 is performed. Step 1149 involves storing the current Vpgm, e.g., in the storage location for acquired program speed data 118 and setting a normal step size. A decision step 1150 determines whether a next program loop should be performed. If the decision step is true (if programming has not been completed for all data states), the program voltage is increased at step 1151 and a next program loop begins at step 1141. Programming is completed for a data state when all or nearly all of the memory cells assigned to the data state are inhibited from programming. If the decision step 1150 is false, the program operation is done at step 1152. If the decision step 1148 is false, step 1151 is reached.

After program speed acquisition has occurred, steps 1147-1149 can be bypassed in subsequent program loops of the program operation.

FIG. 11I depicts a flowchart of a third example implementation of the process of FIG. 11A1 in which acquired program voltages from edge rows or other selected rows of one sub-block are used to determine an initial Vpgm for another sub-block. Step 1160 includes programming memory cells connected to the selected word line in one sub-block in a program speed acquisition mode. Step 1161 includes determining a first acquired Vpgm used when threshold voltages of memory cells of one edge row (or, generally, one row) of the sub-block exceed a verify voltage. See, e.g., row R1 in the sub-block 1410 of FIG. 14B and in the sub-block 1610 of FIG. 16B. Step 1162 includes determining a second acquired Vpgm used when threshold voltages of a memory cells of another edge row (or, generally, another row) of the sub-block exceed the verify voltage. See, e.g., row R4 in the sub-block 1410 of FIG. 14B and in the sub-block 1610 of FIG. 16B. Step 1163 includes determining an initial Vpgm for another sub-block of the block by extrapolating the first acquired Vpgm and the second acquired Vpgm, based on a position of the another sub-block. See, e.g., FIGS. 13C, 15C and 17C. Step 1164 includes programming memory cells connected to the selected word line in the another sub-block using the initial Vpgm.

A decision step 1165 determines if there is a next sub-block to program. If the decision step is false, the process is done at step 1166. If the decision step is true, the process is repeated at step 1164.

Figure 11J:
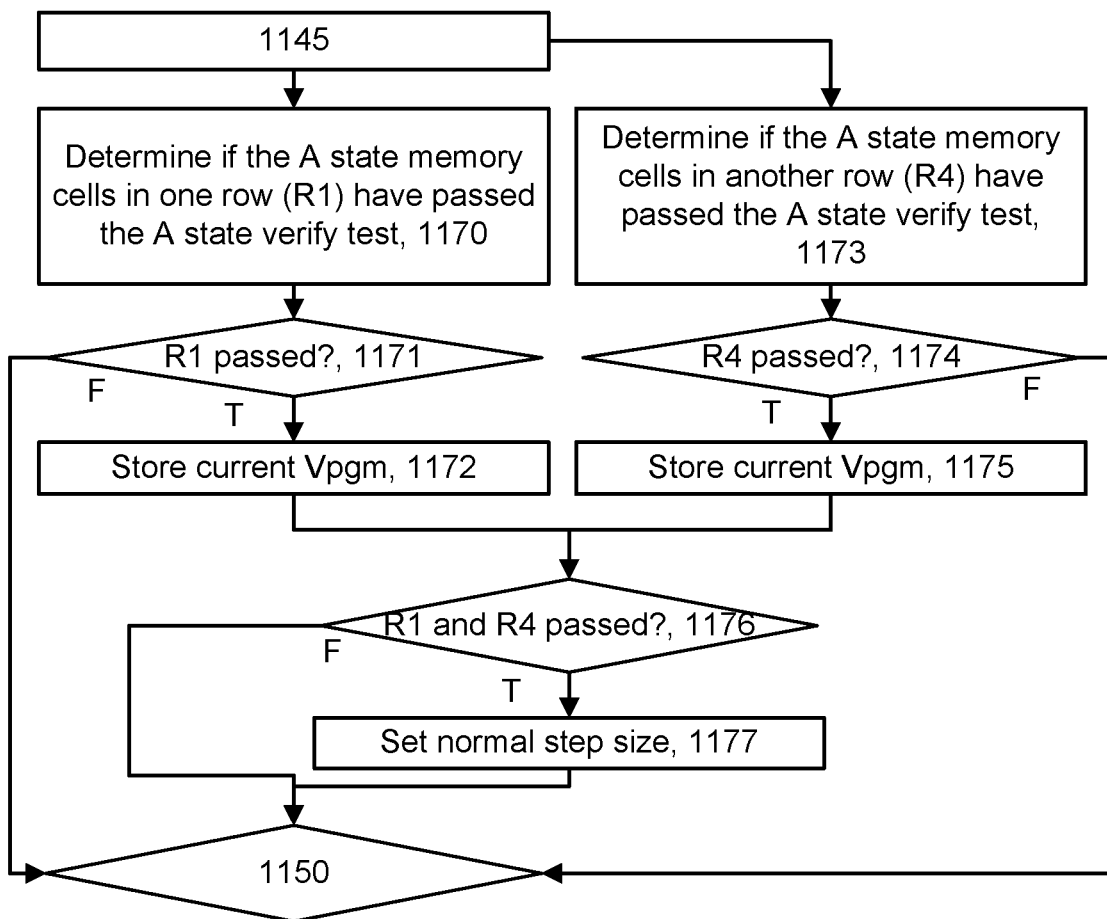
FIG. 11J depicts a flowchart of a modification of the example program operation of FIG. 11H for implementing the process of FIG. 11I.

The processes of FIGS. 11I and 11J can acquire the program voltage from any two rows of a sub-block which may or may not be edge rows. Although, acquiring the program voltage from the two edge rows is advantageous because the program speed difference is greatest for the rows which are spaced furthest apart from one another in a sub-block. The program pulse step size may not be small enough to accurately detect differences in program speeds between adjacent rows of rows which are relatively close to one another in a sub-block.

FIG. 11J depicts a flowchart of a modification of the example program operation of FIG. 11H for implementing the process of FIG. 11I. The process of FIG. 11J replaces steps 1146-1149 of FIG. 11H and depicts a program speed acquisition based on two rows of one sub-block rather than based on two sub-blocks. After step 1145 of FIG. 11H, steps 1170 and 1173 are performed in parallel. Step 1170 includes determining if the A state memory cells in one row (e.g., the edge row R1) have passed the A state verify test, for example. Step 1173 includes determining if the A state memory cells in another row (e.g., the opposing edge row R4) have passed the A state verify test. If R1 has passed, a decision step 1171 is true and the current Vpgm is stored as a first acquired Vpgm at step 1172. A decision step 1176 determines if both R1 and R4 have passed the verify test. If decision step 1176 is true, step 1177 sets a normal step size and step 1150 of FIG. 11H is reached. If R1 has not passed, the decision step 1171 is false and step 1150 of FIG. 11H is reached.

Similarly, if R4 has passed, a decision step 1174 is true and the current Vpgm is stored as a second acquired Vpgm at step 1175. The decision step 1176 is then reached. If R4 has not passed, the decision step 1174 is false and step 1150 of FIG. 11H is reached.

Figure 11K:
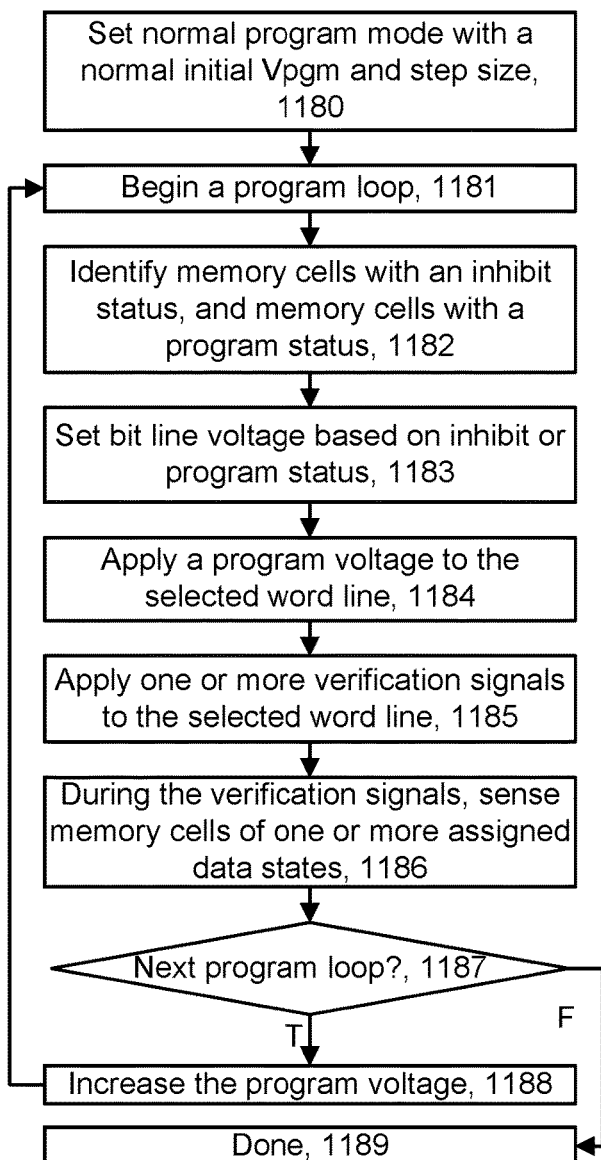
FIG. 11K depicts a flowchart of an example program operation for a sub-block using a normal program mode, consistent with the voltage signal 1010 of FIG. 10A.

FIG. 11K depicts a flowchart of an example program operation for a sub-block using a normal program mode, consistent with the voltage signal 1010 of FIG. 10A. Step 1180 sets a normal program mode with a normal initial Vpgm and step size. Step 1181 begins a program loop. Step 1182 includes identifying memory cells with an inhibit status, and memory cells with a program status. Step 1183 includes setting a bit line voltage based on the inhibit or program status. Step 1184 includes applying a program voltage or pulse to the selected word line while the bit line voltages are set as in step 1183. Step 1185 includes applying one or more verification signals to the selected word line. See the example verification signals 1014 in FIG. 10A. Step 1186 includes, during the verification signals, sensing the memory cells of one or more assigned data states. A decision step 1187 determines whether a next program loop should be performed. If the decision step is true, the program voltage is increased at step 1188 and a next program loop begins at step 1181, if programming has not been completed for all data states. If the decision step 1187 is false, the program operation is done at step 1189.

Figure 12:
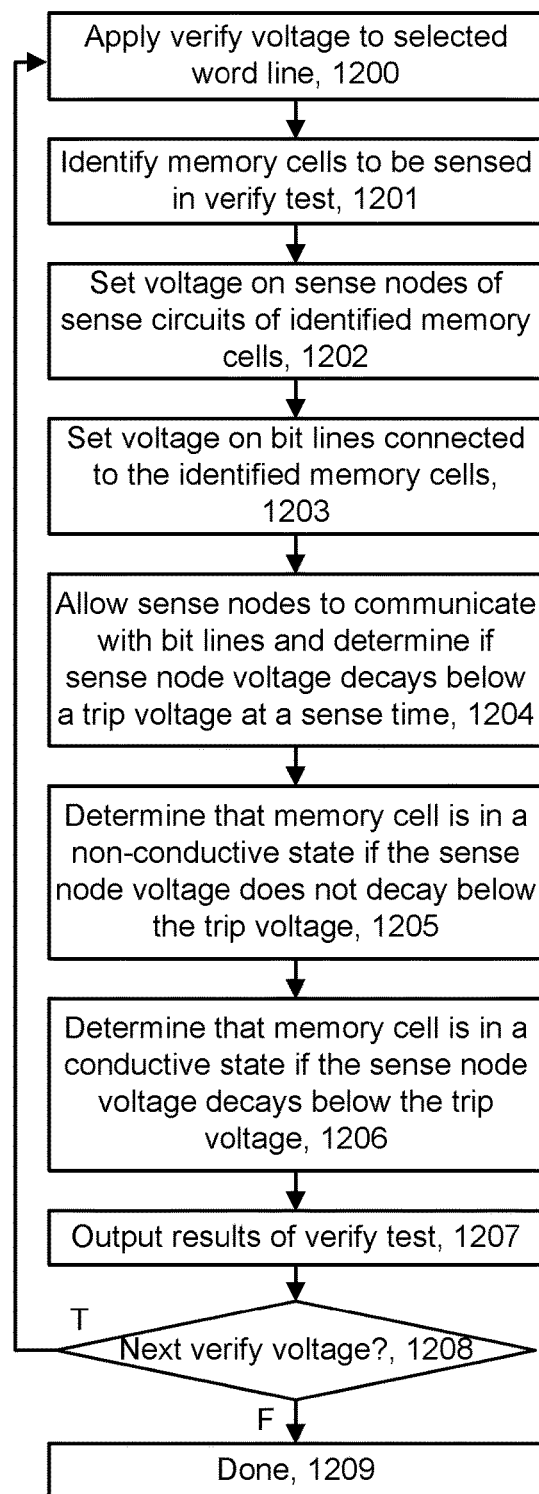
FIG. 12 depicts a flowchart of an example verify process consistent with steps 1145 and 1146 of FIG. 11H, and with steps 1185 and 1186 of FIG. 11K.

FIG. 12 depicts a flowchart of an example verify process consistent with steps 1145 and 1146 of FIG. 11H, and with steps 1185 and 1186 of FIG. 11K. Step 1200 includes applying a verify voltage to a selected word line. Step 1201 includes identifying memory cells to be sensed in a verify test. For example, the memory cells to be sensed can be those which have a program status and are assigned to a data state which matches the current verify voltage applied to the selected word line. Step 1202 includes setting the voltage on the sense nodes of sense circuits of the identified memory cells. These are sense nodes connected to the identified memory cells via respective bit lines. For example, the voltage Vsense can be provided to the sense node 171 in FIG. 2.

Step 1203 includes setting a voltage on bit lines connected to the identified memory cells. For example, the selector 56 in FIG. 2 can provide the voltage Vb1 on the bit line BL. Step 1204 includes allowing the sense nodes to communicate with the respective bit lines and determining, for each of the sense nodes involved in the sensing, if the sense node voltage decays below a trip voltage at a sense time. Step 1205 includes determining that a memory cell is in a non-conductive state if the sense node voltage does not decay below the trip voltage. A memory cell is in a non-conductive state when its Vth exceeds the voltage of the verification signal. This indicates that the memory cell should be inhibited from further programming. Step 1206 includes determining that a memory cell is in a conductive state if the sense node voltage decays below the trip voltage. A memory cell is in a conductive state when its Vth is below the voltage of the verification signal. This indicates that the memory cell should be programmed further. Step 1207 includes outputting results of the verify test, e.g., to a controller.

A decision step 1208 determines if there is a next verify voltage to apply in the current program loop. If the decision step is true, the process is repeated at step 1200. If the decision step is false, the process is done at step 1209.

FIG. 13A depicts an example implementation of the process of FIG. 11G, consistent with the sub-block order 1421 of FIG. 14A, where there is no interruption in the programming of the block. Since there is no interruption, the acquired program voltages of the lowest speed and highest speed sub-block remain in a storage location and are not overwritten. The acquired program voltages can then be retrieved from the storage location and used to determine an initial Vpgm. In one option, the initial Vpgm is stored in the storage location and subsequently retrieved when programming a remaining sub-block.

The example flow includes: (1) Program SB0 (the central sub-block, or one sub-block) using Vpgm_init_low (see FIG. 10A) to acquire Vpgm_acq_SB0 (e.g., 16 V), a first program voltage. Vpgm_acq_SB0 can be the program voltage used in the program loop in which the Vth distribution 923 of FIG. 9C is obtained for SB0. (2) Program SB1 (an edge sub-block) using Vpgm_init_low to acquire Vpgm_acq_SB1 (e.g., 15 V), a second program voltage. Vpgm_acq_SB1 can be the program voltage used in the program loop in which the Vth distribution 923 of FIG. 9C is obtained for SB1. The program loop in which Vpgm_acq_SB1 is acquired is lower than the program loop in which Vpgm_acq_SB0 is acquired because SB1 has a higher program speed than SB0. (3) Calculate Vpgm_init_SB3=Vpgm_acq_SB1+1/3(Vpgm_acq_SB0−Vpgm_acq_SB1)=15.33 V. See FIG. 15B, where SB3 is one third of the way between SB0 and SB1. SB3 is another sub-block after SB0 and SB1. (4) Calculate Vpgm_init_SB5=Vpgm_acq_SB1+2/3(Vpgm_acq_SB0−Vpgm_acq_SB1)=15.67 V. See FIG. 15B, where SB5 is two thirds of the way between SB0 and SB1. (5) Program SB2 using Vpgm_init=Vpgm SB1, since SB2 has the same program speed as SB1 due to its location at the same distance from the nearest edge of the block and thus the same block oxide thickness. (6) Program SB3 using Vpgm_init_SB3. (7) Program SB4 using Vpgm_init_SB3, since SB4 has the same program speed as SB3 due its location at the same distance from the nearest edge of the block. (8) Program SB5 using Vpgm_init_SB5. (9) Program SB6 using Vpgm_init_SB5, since SB6 has the same program speed as SB5 due to its location at the same distance from the nearest edge of the block.

In this example, a control circuit is configured to: store data identifying the first program voltage in a volatile storage location; during programming of memory cells of the edge sub-block, determine a second program voltage applied to the memory cells of the edge sub-block when threshold voltages of a subset of the memory cells of the edge sub-block exceed the verify voltage; store data identifying the second program voltage in the volatile storage location; and since the data identifying the first program voltage and the data identifying the second program voltage are available in the volatile storage location at a start of the programming of the memory cells of the another sub-block, determine the initial program voltage as a voltage which is between the first program voltage and the second program voltage.

FIG. 13B depicts an example implementation of the process of FIG. 11G, consistent with the sub-block order 1421 of FIG. 14A, where there is an interruption between the programming of SB0 and SB1. As mentioned, an interruption to the programming of a block can occur when another block or portion thereof is programmed before completing the programming of the one block. When the programming of the one block is resumed, the acquired program voltage data or initial Vpgm data may have been over written and thus no longer available.

The example flow includes: (1) Program SB0 (one sub-block) using Vpgm_init_low to acquire Vpgm_acq_SB0 (e.g., 16 V), a first program voltage. (2) An interruption occurs in which Vpgm_acq_SB0 is overwritten in the storage location for acquired program speed data 118. (3) Program SB1 (an edge sub-block) using Vpgm_init_low to acquire Vpgm_acq_SB1 (e.g., 15 V), a second program voltage. (4) Program SB2 using Vpgm_init=Vpgm_acq_SB1 since SB2 has the same program speed as SB1. (5) Program SB3 using Vpgm_init=Vpgm_acq_SB1. SB3 is another sub-block after SB0-SB2. (6) Program SB4 using Vpgm_init=Vpgm_acq_SB1. (7) Program SB5 using Vpgm_init=Vpgm_acq_SB1. (8) Program SB6 using Vpgm_init=Vpgm_acq_SB1.

In this implementation, Vpgm_acq_SB1 is used as the initial Vpgm for the remaining sub-blocks SB2-SB6. Vpgm_acq_SB1 is optimal for SB2 since it has the same program speed as SB1. However, Vpgm_acq_SB1 may be lower than optimal as the initial Vpgm for SB3-SB6 since SB1 has a higher program speed than SB3-SB6. An advantage is that over-programming of SB3-SB6 is avoided, and the program voltage does not have to be re-acquired for the block after Vpgm_acq_SB1 is acquired, so a time penalty is minimized.

In this example, the data identifying the first program voltage is not available in the volatile storage location but the data identifying the second program voltage is available in the volatile storage location at the start of the programming of the memory cells of the another sub-block, and a control circuit is configured to determine the initial program voltage based on the second program voltage but not the first program voltage.

The data identifying the first program voltage is not available in the volatile storage location at the start of the programming of the memory cells of the another sub-block when there is programming of memory cells of another block between the programming of the memory cells of the one sub-block and the start of the programming of the memory cells of the another sub-block.

The data identifying the second program voltage is available in the volatile storage location at the start of the programming of the memory cells of the another sub-block when there is no programming of memory cells of another block between the programming of the memory cells of the edge sub-block and the start of the programming of the memory cells of the another sub-block.

FIG. 13C depicts an example implementation of the process of FIG. 11I, consistent with the sub-block order 1420 of FIG. 14A, where there is no interruption in the programming of the block. The example flow includes: (1) Program SB0 using Vpgm_init_low to acquire Vpgm_acq_SB0_R1 (e.g., 15.95 V) and Vpgm_SB0_R4 (e.g., 16.1 V). A separate Vpgm is thus acquired for the two edge rows of a sub-block SB0. (2) Calculate Vpgm_init_SB1=Vpgm_acq_SB0 R4+0.5×(Vpgm_acq_SB0_R4−Vpgm_acq_SB0_R1)=16.1+0.5×(16.1−15.95)=16.175 V. The acquired program voltage of one of the edge rows of SB0 is added to the average of the acquired program voltages of the two edge rows of SB0 to obtain a Vpgm_init for the adjacent sub-block SB1. The acquired program voltages of the edge rows of SB0 are extrapolated to SB1.

(3) Calculate Vpgm_init_SB2=Vpgm_init_SB1+(Vpgm_acq_SB0_R4−Vpgm_acq_SB0_R1)=16.175+0.15=16.325 V. The acquired program voltages of the edge rows of SB0 are extrapolated to SB2. An alternative calculation is Vpgm_init_SB2=Vpgm_acq_SB0 R4+1.5×(Vpgm_acq_SB0_R4−Vpgm_acq_SB0_R1)=16.1+1.5×(16.1−15.95)=16.325 V. (4) Calculate Vpgm_init_SB3=Vpgm_init_SB2+(Vpgm_acq_SB0_R4−Vpgm_acq_SB0_R1)=16.325+0.15=16.475 V. An alternative calculation is Vpgm_init_SB3=Vpgm_acq_SB0 R4+2.5×(Vpgm_acq_SB0_R4−Vpgm_acq_SB0_R1)=16.1+2.5×(16.1−15.95)=16.475 V. The acquired program voltages of the edge rows of SB0 are extrapolated to SB3. (5) Calculate Vpgm_init_SB6=0.5×(Vpgm_acq_SB0 R4+Vpgm_acq_SB0_R1)=0.5×(15.95+16.1)=16.025 V. Vpgm_init for SB6, which has the same program speed as SB0, is set as the average of the acquired program voltages of the edge rows of SB0. (6) Program SB1 using Vpgm_init_SB1. (7) Program SB2 using Vpgm_init_SB2. (8) Program SB3 using Vpgm_init_SB3. (9) Program SB4 using Vpgm_init_SB2 since these sub-blocks have the same program speed. (10) Program SB5 using Vpgm_init_SB1 since these sub-blocks have the same program speed. (11) Program SB6 using Vpgm_init_SB6.

FIG. 14A depicts a side view of an example block 1400 with seven sub-blocks, consistent with FIG. 5A. This is an example of an odd number of sub-blocks in a block so that there is a single central sub-block. The block comprises a plurality of word lines layers or control gate layer spaced apart vertically in a stack between local interconnects (LI) 1401 and 1402. The block includes sub-blocks 1410-1416. Each sub-block has one or more separate SGD layers or plates. For example, the sub-block 1410 has SGD layers 1417 and 1418. The SGD layers of the different sub-blocks are separated by isolation regions (IR) 1403-1408.

The block also comprises a plurality of word lines layers spaced apart vertically between the local interconnects. The local interconnects are adjacent to opposing edges 1430 and 1431 of the block at which an etchant is introduced in the fabrication process. In one approach, a local interconnect comprises metal surrounded by an insulation to provide an insulated conductive path from the top of the stack to the substrate. In another approach, a local interconnect is replaced by an isolation region (e.g., insulation such as oxide with no metal) which does not provide a conductive path through the stack.

The sub-blocks 1410-1416 can be programmed according to different sub-block orders. For example, in the sub-block order 1420, the sub-blocks 1410-1416 are labelled as SB0-SB6, respectively, and programmed from left to right across the block, one sub-block at a time. In the sub-block order 1421, the sub-blocks 1410, 1411, 1412, 1413, 1414, 1415 and 1416 are labelled as SB1, SB3, SB5, SB0, SB6, SB4 and SB2, respectively, and programmed in the order of SB0-SB6, starting from the central sub-block SB0, proceeding to the edge sub-blocks SB1 and SB2, then to the second from the edge sub-blocks SB3 and SB4 and finally to the third from the edge sub-blocks SB5 and SB6.

FIG. 14B depicts a top view of the example block 1400 of FIG. 14A. Each NAND string or memory hole (such as the example NAND string 1435) is represented by an open circle. In FIGS. 14B and 16B, a solid circle represents a connection of a bit line to the NAND string. Bit lines BL0-BL23 extend in the y-direction across the block, parallel to one another, and spaced apart from one another in the x direction. Each bit line is connected to one NAND string in each sub-block. Additionally, the NAND string or memory holes extend in multiple rows in each sub-block, such as rows R1-R4 in sub-block 1410. In this example, there are four rows per sub-block, but there could be fewer or more. Recall that a thickness of the blocking oxide layer is different in one edge row (e.g., R1) compared to the another edge row (e.g., R4) in one sub-block. Similarly, each word line layer of the sub-block comprises multiple rows of memory cells.

The configuration shown provides a higher density of NAND strings compared to using just one row of NAND string per sub-block, although the techniques described herein can also be used with just one row of NAND strings per sub-block.

The rows and sub-blocks are at various distances from a closest edge of the block. For example, the sub-blocks 1410-1412 are at distances of d1-d3, respectively, from the closest edge 1430, and the sub-blocks 1416-1414 are at distances of d1-d3, respectively, from the closest edge 1431. The sub-block 1413 is at the same distance d4 from either edge 1430 or 1431. The distance can be taken at the midpoint of a sub-block to the edge, in one approach. In sub-block 1410, the rows R1-R4 are at distances d1a-d1d, respectively, from the edge 1430.

A region 1440 of the block is depicted in detail in FIG. 14D.

FIG. 14C depicts a plot showing a varying thickness of a blocking oxide layer in the block of FIG. 14B as a function of a distance from a nearest edge of the block. The vertical axis depicts a thickness and the horizontal axis depicts a position along the y direction of the block of FIG. 14B. The thickness ranges from a minimum, Th_min, at the edges 1430 and 1431, where sub-blocks 1410 and 1416, respectively, are located and increases to a maximum, Th_max, at the center of the block, where sub-block 1413 is located.

FIG. 14D depicts the region 1440 of FIG. 14A in further detail, showing the varying thickness of a blocking oxide layer. The region includes four example NAND strings or memory holes, including NAND strings 1432 and 1433 in the sub-block 1410, and the NAND strings 1434 and 1435 in the sub-block 1411. A portion 1401a of the local interconnect is depicted with the edge 1430. The NAND string 1432 includes the components depicted in FIG. 6, including the blocking oxide layer 663, the charge-trapping layer 664, the tunneling layer 665, the channel 660 and the dielectric core 666. The thickness of the blocking oxide layers 663, 663a, 663b and 663c increases progressively from Th_min, Th1, Th2 to Th3 for the NAND strings 1432, 1433, 1434 and 1435, respectively.

FIG. 15A depicts a plot of program voltages versus sub-block position, consistent with the block of FIG. 14A, the process of FIG. 11B and the table of FIG. 11C. In FIG. 15A-15C, the vertical axis depicts a voltage and the horizontal axis depicts a position along the y direction of the block of FIG. 14B. In FIGS. 15A and 15C, the sub-blocks are labelled based on the sub-block order 1420 of FIG. 14A. In FIG. 15B, the sub-blocks are labelled based on the sub-block order 1421 of FIG. 14A. The sub-block labels denote the program order which begins at SB0 and ends at SB6. A solid square and the notation "Vpgm_acq" denotes an acquired program voltage for a sub-block (FIGS. 15A and 15B) or a row of a sub-block (FIG. 15C), while an open square and the notation "Vpgm_init" denotes an initial program voltage for a sub-block which is determined based on the acquired program voltage and a position of the sub-block in the block.

In this example, Vpgm_acq_SB0 is acquired from programming SB0, and each of Vpgm_init_SB1-Vpgm_init_SB6 can be determined from the table of FIG. 11C, for example, by summing Vpgm_acq_SB0 with the corresponding offset voltage of the table.

FIG. 15B depicts a plot of program voltages versus sub-block position, consistent with the block of FIG. 14A and the process of FIGS. 11F, 11G and 13A. Vpgm_acq_SB0 and Vpgm_acq_SB1 are acquired from programming SB0 and SB1, respectively. Vpgm_init_SB3 and Vpgm_init_SB5 can be determined by interpolating between Vpgm_acq_SB0 and Vpgm_acq_SB1 as in the example of FIG. 13A. Vpgm_init_SB2, Vpgm_init_SB4 and Vpgm_init_SB6 can be set to Vpgm_init_SB1, Vpgm_init_SB3 and Vpgm_init_SB5, respectively, as in the example of FIG. 13A.

FIG. 15C depicts a plot of program voltages versus sub-block position, consistent with the block of FIG. 14A and the process of FIGS. 11I, 11J and 13C. Vpgm_acq_SB0_R1 and Vpgm_acq_SB0_R4 are acquired from rows R1 and R4, respectively, when programming SB0. Vpgm_init_SB1, Vpgm_init_SB2 and Vpgm_init_SB3 can be determined by extrapolating a slope of voltage versus position which is set by Vpgm_acq_SB0_R1 and Vpgm_acq_SB0_R4, as in the example of FIG. 13C. Vpgm_init_SB4, Vpgm_init_SB5 and Vpgm_init_SB6 can be set to Vpgm_init_SB2, Vpgm_init_SB1 and Vpgm_init_SB0, respectively, as in the example of FIG. 13C.

FIG. 16A depicts a side view of an example block 1600 with eight sub-blocks, consistent with FIG. 5A. This is an example of an even number of sub-blocks in a block so that there are two central sub-blocks. The block comprises a plurality of word lines layers or control gate layer spaced apart vertically in a stack between local interconnects (LI) 1601 and 1602. The block includes sub-blocks 1610-1617. The SGD layers of the different sub-blocks are separated by isolation regions (IR) 1603-1609.

The block also comprises a plurality of word lines layers spaced apart vertically between the local interconnects. The local interconnects are adjacent to opposing edges 1630 and 1631 of the block at which an etchant is introduced.

The sub-blocks 1610-1617 can be programmed according to different sub-block orders. For example, in the sub-block order 1620, the sub-blocks 1610-1617 are labelled as SB0-SB7, respectively, and programmed from left to right across the block, one sub-block at a time. In the sub-block order 1621, the sub-blocks 1610, 1611, 1612, 1613, 1614, 1615, 1616 and 1617 are labelled as SB2, SB4, SB6, SB0, SB1, SB7, SB5 and SB3, respectively, and programmed in the order of SB0-SB7, starting from the central sub-blocks SB0 and SB1, proceeding to the edge sub-blocks SB2 and SB3, then to the second from the edge sub-blocks SB4 and SB5 and finally to the third from the edge sub-blocks SB6 and SB7.

FIG. 16B depicts a top view of the example block 1600 of FIG. 16A. The rows and sub-blocks are various distances from a closest edge of the block. For example, the sub-blocks 1610-1613 are at distances of d1-d4, respectively, from the closest edge 1630, and the sub-blocks 1617-1614 are at distances of d1-d4, respectively, from the closest edge 1631. In sub-block 1610, the rows R1-R4 are at distances d1a-d1d, respectively, from the edge 1630.

FIG. 16C depicts a plot showing a varying thickness of a blocking oxide layer in the block of FIG. 16B as a function of a distance from a nearest edge of the block. The vertical axis depicts a thickness and the horizontal axis depicts a position along the y direction of the block of FIG. 16B. The thickness ranges from a minimum, Th_min, at the edges 1630 and 1631, where sub-blocks 1610 and 1617, respectively, are located and increases to a maximum, Th_max, at the center of the block, where the sub-blocks 1613 and 1614 are located.

FIG. 17A depicts a plot of program voltages versus sub-block position, consistent with the block of FIG. 17A, the process of FIG. 11B and the table of FIG. 11E. In FIG. 17A-17C, the vertical axis depicts a voltage and the horizontal axis depicts a position along the y direction of the block of FIG. 16B. In FIGS. 17A and 17C, the sub-blocks are labelled based on the sub-block order 1620 of FIG. 16A. In FIG. 17B, the sub-blocks are labelled based on the sub-block order 1621 of FIG. 16A. The sub-block labels denote the program order which begins at SB0 and ends at SB7. A solid square and the notation "Vpgm_acq" denotes an acquired program voltage for a sub-block (FIGS. 17A and 17B) or a row of a sub-block (FIG. 17C), while an open square and the notation "Vpgm_init" denotes an initial program voltage for a sub-block which is determined based on the acquired program voltages and a position of the sub-block in the block.

In this example, Vpgm_acq_SB0 is acquired from programming SB0, and each of Vpgm_init_SB1-Vpgm_init_SB7 can be determined from the table of FIG. 11E, for example, by summing Vpgm_acq_SB0 with the corresponding offset voltage of the table.

FIG. 17B depicts a plot of program voltages versus sub-block position, consistent with the block of FIG. 17A and the process of FIGS. 11F and 11G. Vpgm_acq_SB0 and Vpgm_acq_SB2 are acquired from programming SB0 and SB2, respectively. Vpgm_init_SB4 and Vpgm_init_SB6 can be determined by interpolating between Vpgm_acq_SB0 and Vpgm_acq_SB2. Vpgm_init_SB3, Vpgm_init_SB5, Vpgm_init_SB7 and Vpgm_init_SB1 can be set to Vpgm_init_SB2, Vpgm_init_SB4, Vpgm_init_SB6 and Vpgm_init_SB0, respectively.

FIG. 17C depicts a plot of program voltages versus sub-block position, consistent with the block of FIG. 17A and the process of FIGS. 11I and 11J. Vpgm_acq_SB0_R1 and Vpgm_acq_SB0_R4 are acquired from rows R1 and R4, respectively, when programming SB0. Vpgm_init_SB1, Vpgm_init_SB2 and Vpgm_init_SB3 can be determined by extrapolating a slope of voltage versus position which is set by Vpgm_acq_SB0_R1 and Vpgm_acq_SB0_R4, similar to the example of FIG. 13C. Vpgm_init_SB4-Vpgm_init_SB7 can be set to Vpgm_init_SB3-Vpgm_init_SB0, respectively, similar to the example of FIG. 13C.

FIG. 18 depicts example values in the latches of FIG. 2 during a program operation. A 0 or 1 bit is depicted for each of the latches UDL, MDL and LDL. Each column indicates a different configuration or sequence of bits of the latches for each assigned data state. The column titled Er/Inhibit indicates that, for memory cells which are assigned to the erased state or which are inhibited from programming, the latches have all 1's. The UDL, MDL and LDL latches together provide a sequence of 3 bits which identify the assigned data state of a memory cell. When a memory cell is inhibited from programming, any UDL, MDL and LDL latches with 0 are flipped to 1. By reading the latches, the assigned data state of each selected memory cell can be determined and a corresponding bit line voltage can be set during a program pulse.

FIG. 19 depicts an example set of memory cells connected to a word line selected for programming, where eight data states are used. This simplified example includes 32 memory cells, with 4 memory cells of each of 8 assigned data states. Although the data states are typically randomly distributed among the memory cells, memory cells with a common assigned data state are grouped in this example for simplicity. Each memory cell is represented by a square and the assigned data state (Er-G) is represented by a letter inside the square.

The set 1900 may represent a plurality of memory cells connected to a word line in a sub-block. The plurality of memory cells are configured to store data in a set of data states Er-G. Subsets 1903-1910 of the set 1900 represent memory cells assigned to the Er-G states, respectively. Additionally, a subset 1901 represents memory cells which are configured to be programmed during a program operation. The subset 1903 remains in the erased state during a program operation.

In one implementation, an apparatus comprises: a plurality of memory cells arranged in NAND strings in a plurality of sub-blocks of a block, the NAND strings comprise a plurality of concentric layers, the concentric layers comprise a blocking oxide layer, and a thickness of the blocking oxide layer is different in different sub-blocks of the plurality of sub-blocks; and a control circuit, the control circuit is configured to: during programming of memory cells of one sub-block of the block, determine a first program voltage which is applied to the memory cells of the one sub-block when threshold voltages of a subset of the memory cells of the one sub-block exceed a verify voltage; and determine an initial program voltage for programming memory cells of another sub-block of the block based on the first program voltage and a position of the another sub-block.

In another implementation, a method comprises: programming a plurality of memory cells in a plurality of sub-blocks of a block, wherein the plurality of sub-blocks have different program speeds, the programming of the plurality of memory cells comprises programming the plurality of sub-blocks according to a sub-block programming order in which one or more sub-blocks with a lowest program speed of the block are programmed first, one or more sub-blocks with a highest program speed of the block are programmed next, and remaining sub-blocks with progressively lower program speeds than the highest program speed are programmed subsequently; determining, and storing data indicating, the lowest program speed during the programming of the one or more sub-blocks with the lowest program speed; determining, and storing data indicating, the highest program speed during the programming of the one or more sub-blocks with the highest program speed; at a start of the programming of the remaining sub-blocks, if the data indicating the lowest program speed and the data indicating the highest program speed have not been overwritten, determine a program parameter for the programming of the remaining sub-blocks based on the data indicating the lowest program speed and the data indicating the highest program speed; and if the data indicating the lowest program speed has been overwritten but the data indicating the highest program speed has not been overwritten, determining the program parameter for the programming of the remaining sub-blocks based on the data indicating the highest program speed but not the data indicating the lowest program speed.

In another implementation, an apparatus comprises: a plurality of memory cells arranged in NAND strings in a plurality of sub-blocks of a block, each sub-block comprising multiple of rows of the NAND strings, the NAND strings comprise a plurality of concentric layers, the concentric layers comprise a blocking oxide layer; and a control circuit, the control circuit is configured to: during programming of memory cells of one sub-block, determine a first program voltage which is applied to the memory cells of the one sub-block when threshold voltages of memory cells of one row of the one sub-block exceed a verify voltage and determine a second program voltage which is applied to the memory cells of the one sub-block when threshold voltages of memory cells of another row of the one sub-block exceeds the verify voltage; and determine an initial program voltage for programming memory cells of another sub-block based on the first program voltage, the second program voltage and a position of the another sub-block of the block.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
    a plurality of memory cells arranged in NAND strings in a plurality of sub-blocks of a block, the NAND strings comprise a plurality of concentric layers, the concentric layers comprise a blocking oxide layer, and a thickness of the blocking oxide layer is different in different sub-blocks of the plurality of sub-blocks; and
    a control circuit, the control circuit is configured to:
        during programming of memory cells of one sub-block of the block, determine a first program voltage which is applied to the memory cells of the one sub-block when threshold voltages of a subset of the memory cells of the one sub-block exceed a verify voltage; and
        determine an initial program voltage for programming memory cells of another sub-block of the block based on the first program voltage and a position of the another sub-block, wherein the memory cells of the one sub-block are in NAND strings which are a first distance from an edge of the block, and the memory cells of the another sub-block are in NAND strings which are a second distance, different than the first distance, from the edge of the block.

2. The apparatus of claim 1, wherein:
the another sub-block is between the one sub-block and an edge sub-block of the block; and
the control circuit is configured to:
    during programming of memory cells of the edge sub-block, determine a second program voltage applied to the memory cells of the edge sub-block when threshold voltages of a subset of the memory cells of the edge sub-block exceed the verify voltage; and
    determine the initial program voltage by interpolating between the first program voltage and the second program voltage.

3. The apparatus of claim 2, wherein:
multiple sub-blocks comprising the another sub-block are between the one sub-block and the edge sub-block; and
the interpolation between the first program voltage and the second program voltage is based on the position of the another sub-block among the multiple sub-blocks.

4. The apparatus of claim 1, wherein:
the another sub-block is between the one sub-block and an edge sub-block of the block; and
the control circuit is configured to:
    store data identifying the first program voltage in a volatile storage location;
    during programming of memory cells of the edge sub-block, determine a second program voltage applied to the memory cells of the edge sub-block when threshold voltages of a subset of the memory cells of the edge sub-block exceed the verify voltage;
    store data identifying the second program voltage in the volatile storage location; and
    if the data identifying the first program voltage and the data identifying the second program voltage are available in the volatile storage location at a start of the programming of the memory cells of the another sub-block, determine the initial program voltage as a voltage which is between the first program voltage and the second program voltage.

5. The apparatus of claim 1, wherein:
the one sub-block is a central sub-block of the block;
the another sub-block is between the central sub-block and an edge sub-block of the block; and
the control circuit is configured to program the plurality of sub-blocks in a sub-block programming order in which the central sub-block is programmed first, the edge sub-block is programmed after the central sub-block and the another sub-block is programmed after the edge sub-block.

6. The apparatus of claim 1, wherein:
the memory cells of the one sub-block are connected to a word line among a set of word lines; and
the control circuit is configured to determine an initial program voltage to program memory cells of the one sub-block connected to another word line of the set of word lines, based on the first program voltage.

7. The apparatus of claim 1, wherein:
the first distance is greater than the second distance.

8. The apparatus of claim 2, wherein:
the edge of the block is closer to the memory cells of the edge sub-block than to the memory cells of the another sub-block.

9. A method, comprising:
programming a plurality of memory cells in a plurality of sub-blocks of a block, wherein the plurality of sub-blocks have different program speeds, the programming of the plurality of memory cells comprises programming the plurality of sub-blocks according to a sub-block programming order in which one or more sub-blocks with a lowest program speed of the block are programmed first, one or more sub-blocks with a highest program speed of the block are programmed next, and remaining sub-blocks with progressively lower program speeds than the highest program speed are programmed subsequently;

determining, and storing data indicating, the lowest program speed during the programming of the one or more sub-blocks with the lowest program speed;

determining, and storing data indicating, the highest program speed during the programming of the one or more sub-blocks with the highest program speed;

at a start of the programming of the remaining sub-blocks, if the data indicating the lowest program speed and the data indicating the highest program speed have not been overwritten, determine a program parameter for the programming of the remaining sub-blocks based on the data indicating the lowest program speed and the data indicating the highest program speed; and if the data indicating the lowest program speed has been overwritten but the data indicating the highest program speed has not been overwritten, determining the program parameter for the programming of the remaining sub-blocks based on the data indicating the highest program speed but not the data indicating the lowest program speed.

10. The method of claim 9, wherein:

the program parameter for the programming of the remaining sub-blocks comprises an initial program voltage in a series of program voltages.

\* \* \* \* \*